(12) United States Patent
Chaput

(10) Patent No.: US 11,024,793 B1
(45) Date of Patent: Jun. 1, 2021

(54) HIGH-RESOLUTION SENSING OF PIEZO-ELECTRIC TRANSDUCERS

(71) Applicant: Boréas Technologies Inc., Bromont (CA)

(72) Inventor: Simon Chaput, Magog (CA)

(73) Assignee: Boreas Technologies Inc., Bromont (CA)

( * ) Notice: Subject to any disclaimer, the term of this patent is extended or adjusted under 35 U.S.C. 154(b) by 0 days.

(21) Appl. No.: 15/929,890

(22) Filed: May 28, 2020

(51) Int. Cl.
| | |
|---|---|
| *H01L 41/04* | (2006.01) |
| *H02N 2/00* | (2006.01) |
| *G01L 1/16* | (2006.01) |
| *H02P 11/00* | (2006.01) |

(52) U.S. Cl.
CPC .............. *H01L 41/042* (2013.01); *G01L 1/16* (2013.01); *H02N 2/0075* (2013.01); *H02P 11/00* (2013.01)

(58) Field of Classification Search
CPC .......... H01L 4/42; G01L 1/16; H02N 2/0075; H02P 11/00; G05B 2219/14076; G05B 19/406
See application file for complete search history.

(56) References Cited

U.S. PATENT DOCUMENTS

| | | | |
|---|---|---|---|
| 10,199,555 B2 | 2/2019 | Chaput | |
| 2018/0021811 A1* | 1/2018 | Kutej | H01L 41/042 367/13 |
| 2019/0379288 A1 | 12/2019 | Chaput et al. | |
| 2020/0098967 A1 | 3/2020 | Chaput et al. | |

\* cited by examiner

*Primary Examiner* — Karen Masih
(74) *Attorney, Agent, or Firm* — Stratford Managers Corporation

(57) ABSTRACT

In a driver for a piezo-electric transducer, when a converter circuit and a sensing circuit are the same circuit, many limitations exist on the accuracy of the sensing, due to multiple parasitic effects arising from the interconnection of the power devices. These limitations may limit viability of the sensing for many applications, in particular an accurate determination of when the force on the piezo-electric transducer is fully removed. Providing an additional switch in the sensing circuit configured to repeatedly zero the sensed voltage across the piezo-electric transducer each time the sensed voltage reaches a threshold voltage generates a plurality of voltage segments between zero and the threshold voltage. Accordingly, a controller may then be configured to generate a digital reconstruction of the sensed voltage across the piezo-electric transducer by adding the plurality of voltage segments.

20 Claims, 9 Drawing Sheets

HIGH-RESOLUTION SENSING OF PIEZO-ELECTRIC TRANSDUCERS

TECHNICAL FIELD

The present invention relates to a driver circuit for piezo-electric or electro-active transducers, and in particular to a driver circuit with higher-resolution sensing for piezo-electric transducers.

BACKGROUND

In conventional haptic feedback systems, which use the piezo-electric effect, a driver circuit applies a high-voltage signal to the piezo-electric transducer, and in response to the applied high-voltage signal, the piezo-electric transducer generates a mechanical movement sufficient to give a haptic sensation to a user. In addition, when a force is applied to the piezo-electric transducer by the user, a sensing circuit generates a sensed voltage signal, which enables the piezo-electric transducer to act as a switch.

When the driver circuit and the sensing circuit are the same circuit, many limitations exist on the accuracy of the sensing, due to multiple parasitic effects arising from the interconnection of the power devices. These limitations may limit viability of the sensing for many applications.

An object of the present invention is to overcome the shortcomings of the prior art by providing a higher resolution sensing driver circuit for any electro-active transducer, such as a piezo-electric transducer.

SUMMARY OF THE INVENTION

Accordingly, the present invention relates to a method of operating a piezo-electric transducer with a piezo-electric driver circuit, including a first switch with a first parasitic conduction path, the method comprising:

repeatedly sensing a first sensed voltage generated by a first force applied to a first piezo-electric transducer;

discharging the first sensed voltage each time the first sensed voltage approaches a first trigger level of the first parasitic conduction path, thereby generating a plurality of first voltage segments; and determining a first total sensed voltage across the first piezo-electric transducer from the plurality of first segment voltages.

Another aspect of the present invention relates to an apparatus for operating a first piezo-electric transducer, configured for coupling to a voltage source, which provides an input voltage, and configured to transmit a drive voltage across the first piezo-electric transducer, the apparatus comprising:

a driver circuit, comprising a first driver circuit switch including a first parasitic conduction path, configured to be connected to the first piezo-electric transducer, the driver circuit configured to receive the input voltage and transmit the drive voltage for generating a force or displacement response on the first piezo-electric transducer;

a sensing circuit configured to sense a first sensed voltage generated by a first force applied to the first piezo-electric transducer, the sensing circuit including a first sensing switch; and a controller configured to control the first driver switch and the first sensing switch, to discharge the first sensed voltage each time the first sensed voltage approaches a first trigger level of the first parasitic conduction path generating a plurality of first segment voltages, and configured to determine a first total sensed voltage across the first piezo-electric transducer from the plurality of first segment voltages.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
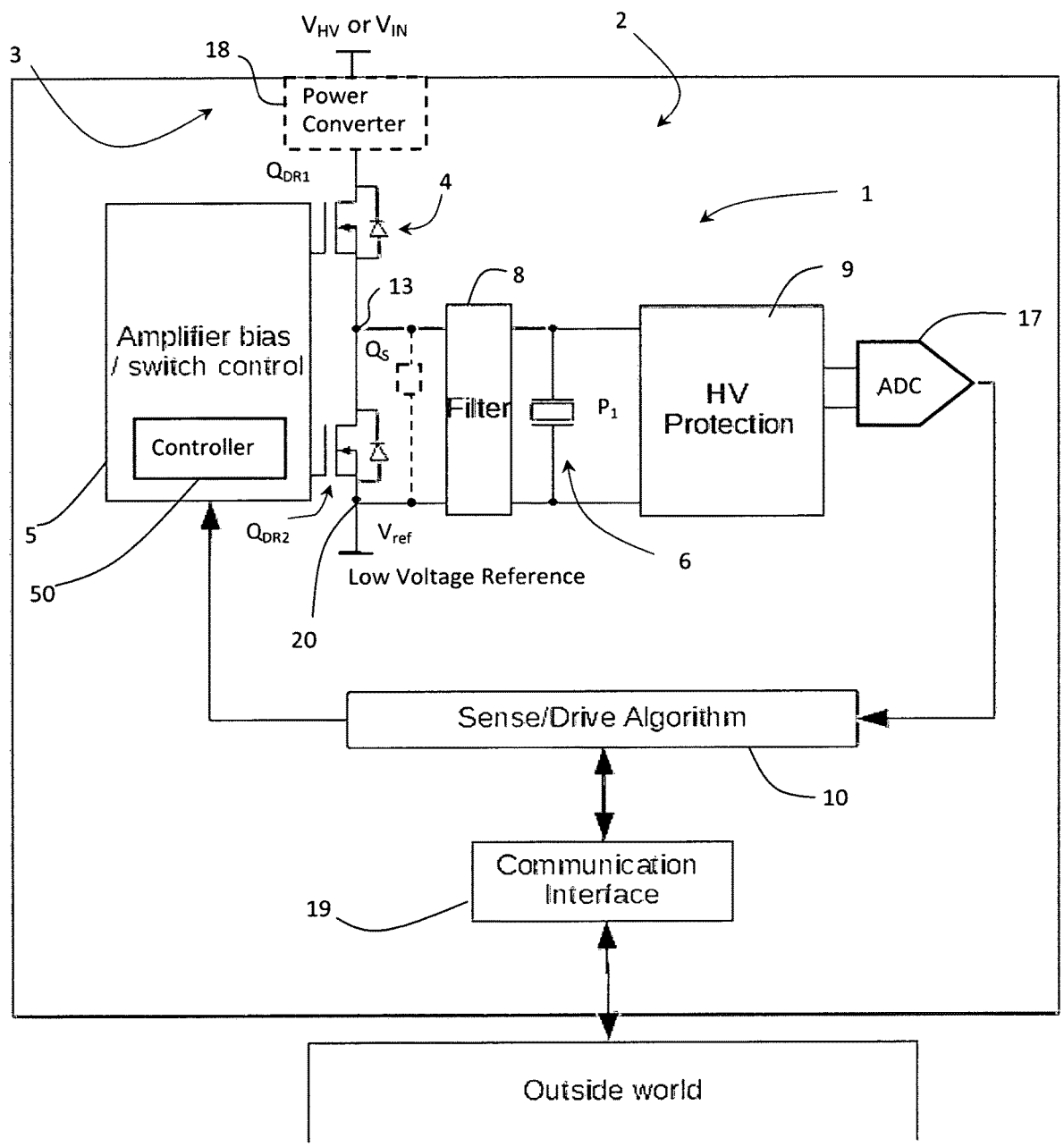
FIG. 1 is a schematic diagram of a piezo-electric transducer system in accordance with an embodiment of the present disclosure.

FIG. 1 illustrates a piezo-electric transducer system 1 that may use a piezo-electric transducer $P_1$ or some other form of transducers, such as electro-active polymer transducers, both as an actuator for driving, e.g. haptic feedback, and for force sensing, e.g. a switch or level control. Typically, circuits are designed to either drive the piezo-electric transducer $P_1$ or sense a force applied to the piezo-electric transducer $P_1$. When combining both functionalities in the same system and/or when operating a plurality of piezo-electric transducers simultaneously, complications arise from the parasitic paths created by the output devices (transistors) of the driver section of the system. Conventional systems, such as those disclosed in EP 3065029 (Kyocera), require four or five switches in addition to the drive and detection units to change between the different modes and isolate the parasitic paths.

The piezo-electric transducer system 1, includes a piezo-electric transducer circuit 2 comprising an input stage 3, a driver stage 4, an amplifier bias/switch control 5, and an output stage 6, including a piezo-electric transducer $P_1$ or some other electro-active transducer. The piezo-electric transducer circuit 2 may be implemented in a single chip or using discrete parts due to the high power to process. The input stage 3 may include or be connected to a high-voltage voltage source $V_{HV}$, typically between 20 V and 200 V, whereby the driver stage 4 simply drives the desired driver voltage $V_{DR}$ at a value between $V_{HV}$ and $V_{ref}$, which has the same magnitude as the high voltage source $V_{HV}$ or a stepped down magnitude, e.g. typically between 20 V and 80 V, as the output voltage $V_{out}$ at an output node 13 and to the output stage 6, e.g. across the piezo-electric transducer $P_1$.

Alternatively, the input stage 3 may include or be connected to a low-voltage source $V_{IN}$, such as a battery, typically between 2 V and 10 V, preferably 3.6 V to 5V, whereby the driver stage 4 also includes a power converter circuit 18 for converting the input voltage $V_{in}$ to a higher peak, e.g. 30V-60V, AC driver voltage $V_{DR}$. The power converter circuit 18 may comprise a plurality of switches, e.g. power converting transistors, and other electrical components, such as inductors and capacitors for amplifying the input voltage $V_{in}$ to the desired driver voltage $V_{DR}$.

The driver stage 4 may include one or more driver stage switches, e.g. first and second driver transistors $Q_{DR1}$ and $Q_{DR2}$, configured to bias the output node 13 with the required drive voltage $V_{DR}$ as the output voltage $V_{out}$ for selectively transmitting the drive voltage $V_{DR}$ to the output stage 6, The second drive transistor $Q_{DR2}$, extending between the output node 13 and reference node 20 across the piezo-electric transducer $P_1$ may also be configured for discharging the output node 13, e.g. back to 0V, after the driver stage 4 actuates the piezo-electric transducer $P_1$ to enable normal sensing to proceed.

The amplifier bias/switch control 5 may comprise a controller 50, which controls the bias of the driver stage switches $Q_{DR}$, e.g. the first and second switches $Q_{DR1}$ and $Q_{DR2}$, and if necessary the power converter switches. There are many ways to design the amplifier bias/switch control 5 to achieve a desired system specification. The controller 50 may also continuously sense the output voltage $V_{out}$, e.g. from an output node 13, for determining whether an external force has been applied to the piezo-electric transducer $P_1$, e.g. by a user. In particular, the controller 50 determines whether the external force, and a resulting sensed voltage $V_{Sens}$ from the piezo-electric transducer $P_1$ measured as the output voltage $V_{out}$, exceeds an activation level, which results in the controller 50 activating the driver stage 4 to transmit the driver voltage $V_{DR}$ to the piezo-electric transducer $P_1$ to generate a haptic response, e.g. vibration, translation and/or noise. The output voltage $V_{out}$ is the voltage measured between the output node 13 and the reference voltage $V_{ref}$, which may comprise the sensed voltage $V_{Sens}$ and/or the driver voltage $V_{DR}$, depending on the current activities of the piezo-electric transducer system 1. The controller 50 may also activate the driver stage 4 to transmit the driver voltage $V_{DR}$ to the piezo-electric transducer $P_1$ to generate a haptic response, in response to an external instruction signal from the outside world, e.g. a host electronic device incorporating the piezo-electric transducer system 1, such as a smart watch, a smart phone or tablet.

A passive filter 8 may be provided in the output stage 6, e.g. parallel to a load 15, such as one or more piezo-electric transducers $P_1$, configured to filter the output, e.g. the drive voltage signal $V_{DR}$, of the piezo-electric transducer circuit 2. The passive filter 8 is optional, but could be used without changing the high-level behavior of the system 1. The passive filter 8 may be inserted between the driver stage 4 and the load 15 to remove high-frequency content in the drive voltage signal $V_{DR}$ before reaching the load 15. The passive filter 8 is particularly useful when the driver stage 4 uses a Class-D amplifier topology.

The reference voltage $V_{ref}$ represents the voltage reference for the load 15, e.g. the piezo-electric transducer $P_1$. The reference voltage $V_{ref}$ may be ground or any other convenient voltage in the system, e.g. $V_{in}$.

A high voltage protection circuit 9, which may be included in the amplifier bias/switch control 5 or separate therefrom, comprises an electronic architecture that either adapts or blocks the output voltage $V_{out}$ from the output node 13, i.e. the sensed voltage signal $V_{Sens}$ from the load 15 and/or the driver voltage $V_{DR}$ from the driver stage 4, to an appropriate, e.g. safe, voltage level for one or more analog to digital converters ADC 17. The one or more ADC 17 convert the output voltage $V_{out}$, i.e. the sensed voltage signal $V_{Sens}$ and/or the drive voltage signal $V_{DR}$, to a digital representation, and conveys the corresponding digital value of the magnitude of the sensed voltage signal $V_{Sens}$ and/or the drive voltage signal $V_{DR}$ to the controller 50 in the amplifier bias/switch control 5.

A sense/drive algorithm 10, which may be in the form of computer hardware or computer software stored on non-transitory memory, either as part of the piezo-electric transducer system 1 or in a separate memory storage device, enables the amplifier bias/switch control 5, and in particular the controller 50, to accurately sense the load, e.g. the sensed voltage $V_{Sens}$ across the piezo-electric transducer $P_1$, even when the sensed voltage signal $V_{Sens}$ would trigger a parasitic conduction path, e.g. forward bias a body diode, of any of the driver transistors $Q_{DR}$ directly connected to the piezo-electric transducer $P_1$, e.g. the first or the second switches $Q_{DR1}$ and $Q_{DR2}$, during various applications. For example: during removal of a force on the piezo-electric transducer $P_1$ after actuation of piezo-electric transducer $P_1$, a negative voltage, e.g. −2 V, may be generated, which causes parasitic leakage in at least one of the driver transistors $Q_{DR}$, e.g. the second switch $Q_{DR2}$, and prevents the controller 50 from accurately determining the force that has been applied to the piezo-electric transducer $P_1$, in particular if the force and resulting sensed voltage $V_{Sens}$ is large enough to exceed the activation level.

Accordingly, a sensing switch $Q_S$ may be provided to repeatedly zero the output voltage $V_{out}$, i.e. the sensing voltage $V_{Sens}$, from the output node 13 to enable a compilation of voltage segments used to determine the actual sensing voltage $V_{Sens}$. For example, the sensing switch, e.g. a sensing transistor $Q_S$, may be connected between the piezo-electric transducer $P_1$, e.g. the output node 13, and the reference voltage, e.g. $V_{ref}$, $V_{in}$ or ground, with a control terminal, e.g. a gate, connected to the controller 50, which enables the sensed voltage $V_{Sens}$ across the piezo-electric transducer $P_1$ to be zeroed, i.e. discharged, to the reference voltage $V_{ref}$, when needed, as hereinafter disclosed in detail. The second driver switch $Q_{DR}$ or some other suitable switch, e.g. transistor, already provided in the piezo-electric transducer system 1 may also be used as the sensing switch $Q_S$.

A communication interface 19 enables the system 1 to receive and send signals relating to driving the one or more piezo-electric transducers $P_1$ and/or sensing a force application on the one or more piezo-electric transducers $P_1$ to and from the outside world, e.g. the host electronic device incorporating the piezo-electric transducer system 1, such as a smart watch, a smart phone or tablet. Activation of the piezo-electric transducer $P_1$ may provide an indication to the host device of any form of user input, e.g. on/off, volume up, volume down, enter, etc.

Figure 2B:
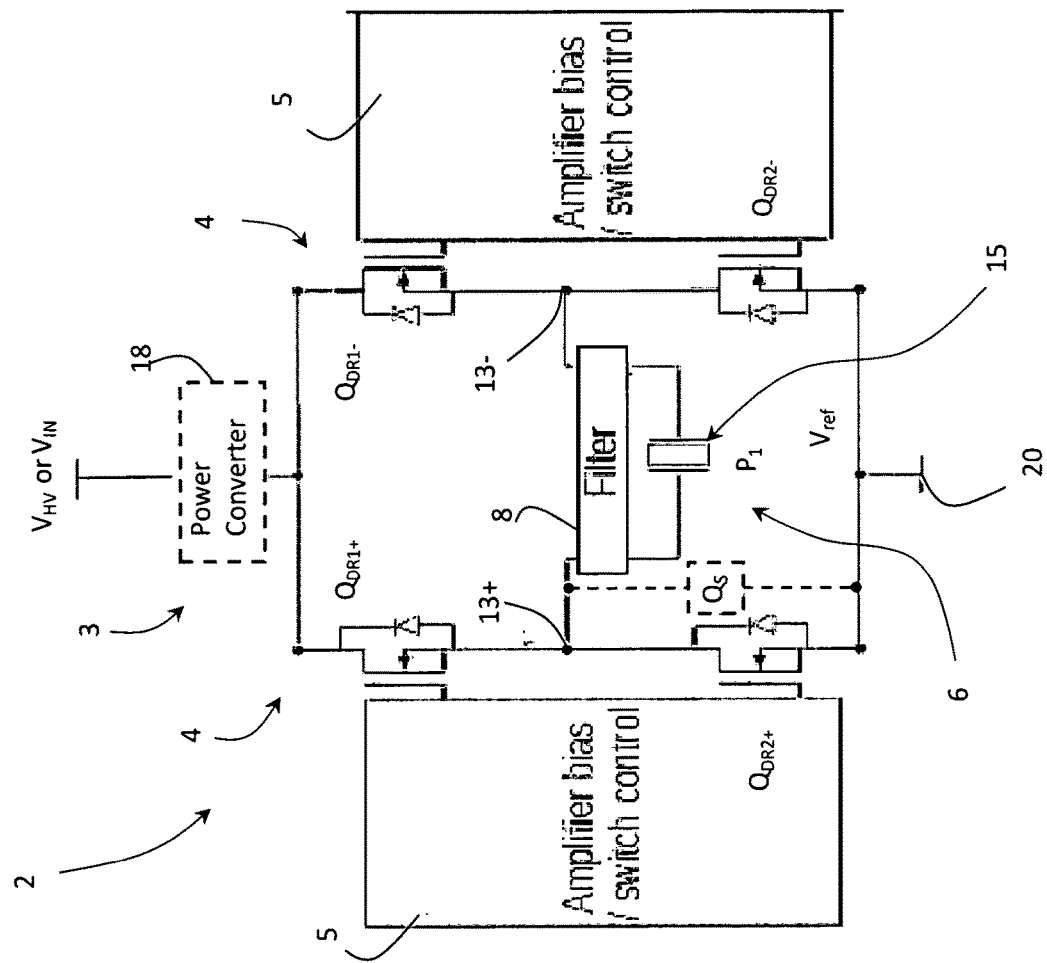
FIGS. 2A and 2b are schematic diagrams of a piezo-electric transducer driver circuits in accordance with an embodiment of the present disclosure.
Figure 2A:
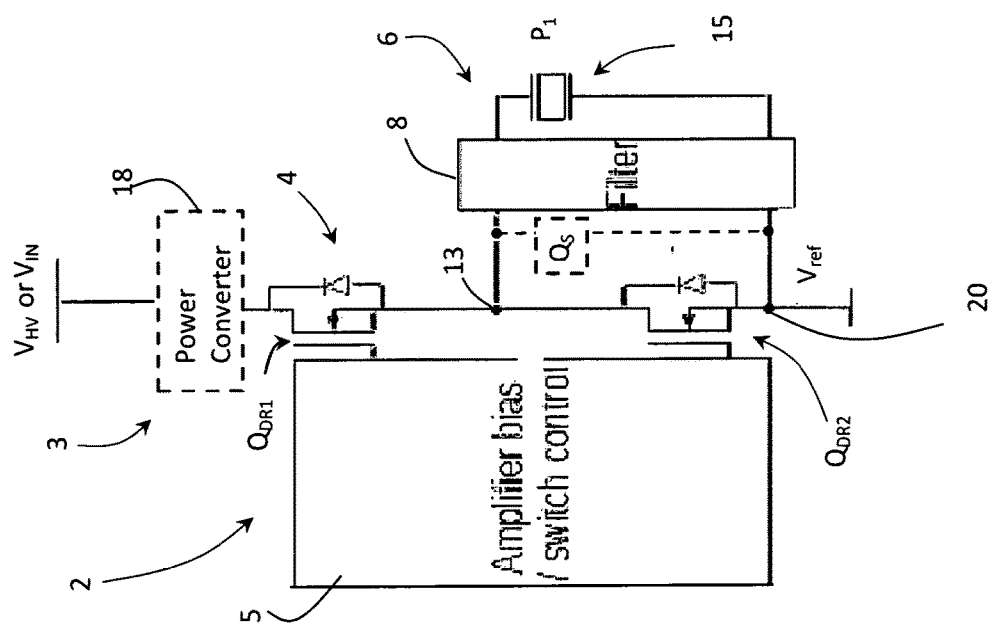

FIGS. 2A and 2B represent two embodiments for piezo-electric transducer circuits 2. The driver stage 4 may be based on different amplifier architectures, e.g. Class-A, Class AB, Class D, etc, but from an architecture and component perspective, the load 15, e.g. the one or more electro-active or piezo-electric transducers $P_1$, is connected between the output node 13 and the reference voltage node $V_{ref}$ or node 20 for a unipolar output (FIG. 2A). For a bipolar output, e.g. FIG. 2B, each end of the load 15 is connected at a different output node 13+ and 13−. In all cases, the output voltage $V_{out}$ at the output nodes 13+ and 13−, e.g. the driver voltage $V_{DR}$ and/or the sensed voltage $V_{Sens}$, may be controlled minimally by one or more switches, e.g. transistors $Q_{DR1+}$, $Q_{DR1-}$, $Q_{DR2+}$, and $Q_{DR2-}$, enabling the current to flow between the high voltage supply $V_{HV}$ or $V_{in}$ (or current source) and the reference voltage $V_{ref}$ e.g. reference node 20 across the load 15.

Figure 3:
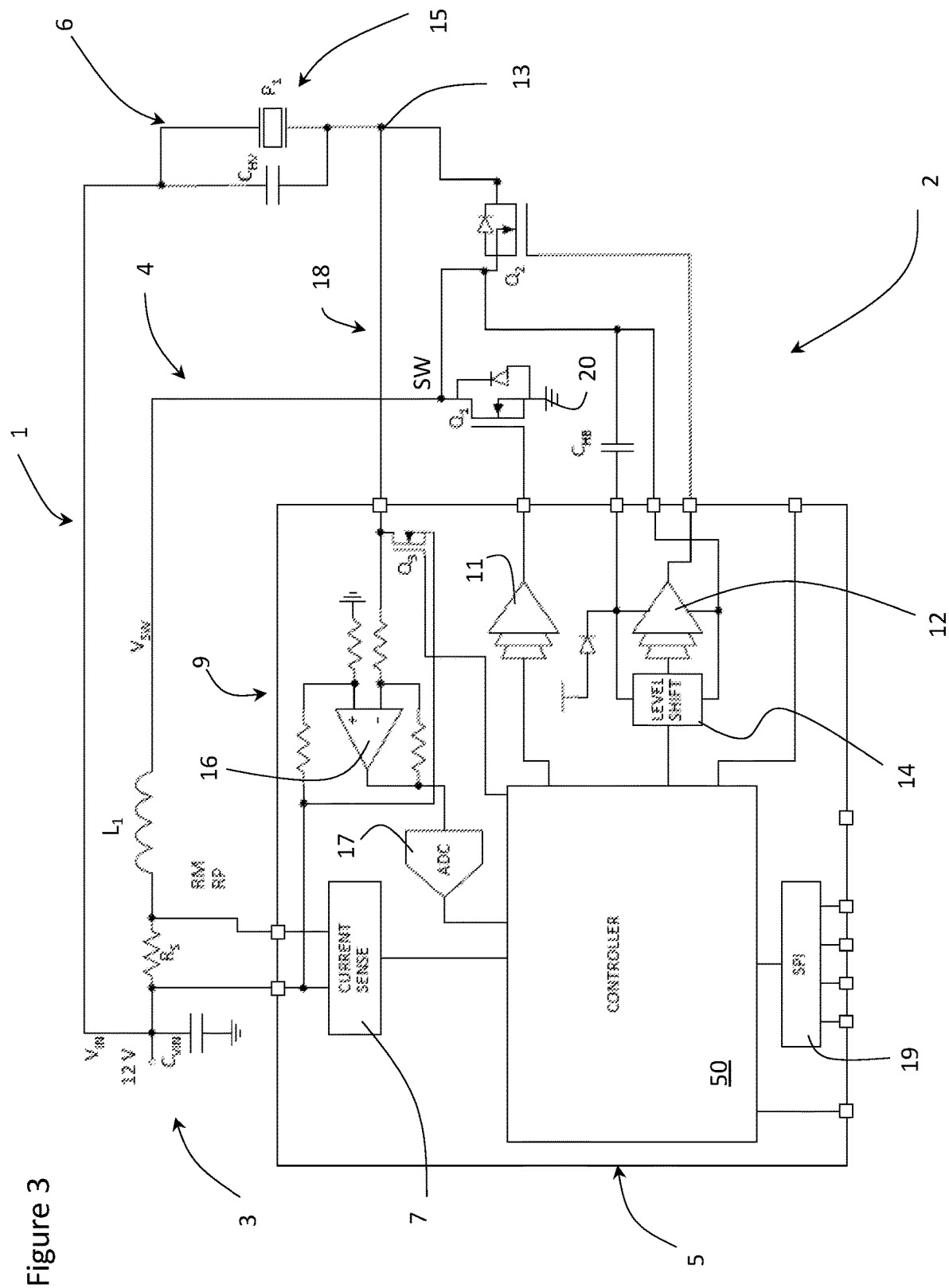
FIG. 3 is a schematic diagram of a piezo-electric transducer system in accordance with an embodiment of the present invention.

One exception is presented in FIG. 3, which illustrates a two-transistor architecture as described in U.S. Pat. No. 10,199,555, issued Feb. 5, 2019 in the name of Simon Chaput, incorporated herein by reference. The two-transistor driver stage 4 enables the sinking and sourcing of current in the load 15 through the second switch $Q_2$. In all figures, the body diode of the first and second switches $Q_1$ and $Q_2$ are represented by a diode symbol to show explicitly the parasitic path. For all transistors, if a conducting terminal to conducting terminal, e.g. Drain-Source (VDs), voltage becomes negative enough, e.g. above the leakage or turn-on voltage of the body diode of the second switch $Q_2$ connected to the load 15, the current will start to flow from the first conducting terminal, e.g. source, to the second conducting terminal, e.g. drain, via the body diode. The leakage voltage at which the current will start to flow in the diode may be between 0.2 V and 0.7 V typically depending on the exact device and semiconductor technology used. To ease the explanation, we are assuming an N-type MOS transistor is used; however, a skilled person in the art will recognize that a similar situation happens with other transistors, e.g. P-type devices.

The piezo-electric transducer system 1, includes the piezo-electric transducer circuit 2 comprising the input stage 3, the driver stage 4, the amplifier bias/switch control 5, and the output stage 6. The piezo-electric transducer system 1 may be implemented in a single chip or using discrete parts due to the high power to process. The input stage 3 may be connected to the voltage source $V_{IN}$, such as a battery, typically with an input voltage $V_{in}$ of between 6 V and 20 V, preferably 9V to 16V. The driver stage 4 may be comprised of the power converter circuit 18 including a forward-boost/reverse-buck converter that generates a clean sine waveform. The power converter circuit 18 of the driver stage 4 may include an inductor $L_1$ connected to the voltage source $V_{IN}$, and the driver stage switches, e.g. driver transistors $Q_{DR}$, consisting of a first low side switch $Q_1$ connected between the inductor $L_1$ and ground, and a second driver switch $Q_2$ connected between the inductor $L_1$ and the output stage 6. The control terminal, e.g. gate, of the transistor in the first switch $Q_1$ may be connected to a first gate driver 11 in the amplifier bias/switch control 5, and the control terminal, e.g. gate, of the transistor in the second switch $Q_2$ may be connected to a second gate driver 12 in the amplifier bias/switch control 5. Both the first gate driver 11 and the second gate driver 12 may be connected to the controller 50, which sends control signals to the first and second gate drivers 11 and 12 to control operation of the first and second switches $Q_1$ and $Q_2$, respectively.

While the aforementioned embodiment is described being used for sine waveforms, persons having ordinary skill in the art will appreciate the embodiments described herein may operate upon arbitrary and complex analogue waveforms, for example, square, triangular, AM modulated, FM modulated, and are not limited to operating upon sine waveforms.

The input stage 3 may include a filter capacitor ($C_{VIN}$) connected across the low voltage source $V_{IN}$ and ground, and a sense resistor ($R_S$) connected between the low voltage source $V_{IN}$ and the single inductor $L_1$. The single inductor $L_1$ may be connected between the sense resistor $R_S$ and a switching node SW of the driver stage 4. A current sensor 7, which may be included in the amplifier bias/switch control 5, may be connected on either side of the sense resistor $R_S$ and to the controller 50 for measuring the current, and/or the voltage entering the inductor $L_1$ and the driver stage 4. The current sensor 7 provides bidirectional current sensing in all possible switching condition during operation, for example, borderline conduction mode, discontinuous conduction mode and continuous conduction mode. The current feedback sensor 7 ensures the first switch $Q_1$ and the second switch $Q_2$ turn on/off at the right time to avoid high switching losses at the switching node SW.

The second switch $Q_2$ may be an N-type transistor including a first conducting terminal, e.g. source, connected to the switching node SW and referenced to the switching node voltage $V_{sw}$, a second conducting terminal, e.g. drain, connected to the load 15, and a third control terminal, e.g. gate, connected to the controller 50. In order to control the control terminal appropriately, a level shift block 14, which may be included in the amplifier bias/switch control 5, translates a control signal from the controller 50 referenced to ground into a signal referenced to a switching node voltage $V_{sw}$ at the floating switching node SW. Under the first embodiment the level shift block 14 enables scaling of a digital control signal amplitude from a digital logic level to a higher amplitude suitable for the second switch $Q_2$, for example, scaling from 1.8V to 5V.

The level shift block 14 may change the reference voltage $V_{ref}$, i.e. the reference node 20, for the drive voltage signal $V_{DR}$ from ground to an arbitrary floating node, in this case, the switching node SW. While FIG. 3 illustrates an N-type transistor for the first and second switches $Q_1$ and $Q_2$, in an alternative embodiment, a different type of switch, e.g. a P-type transistor, may be used with similar requirement for a level shift block. For P-type switch transistors, the level shift block 14 may use a floating bootstrap supply (not shown) to provide the desired level for the output of the level shift block 14.

Although desirable that the differential drive voltage signal ($V_{DR}-V_{IN}$) be very clean, it is not necessary for the output voltage $V_{out}$, e.g. the drive voltage signal $V_{DR}$ or the sense voltage $V_{Sens}$ at the output node 13 to be referenced to ground. The high voltage protection circuit 9 may include a difference amplifier 16, which measures continuously the differential drive voltage between the reference voltage $V_{IN}$ and the output voltage $V_{out}$ at output node 13, i.e. the drive voltage $V_{DR}$ and/or the sensed voltage $V_{Sens}$, and converts the difference to a single-ended signal fed to the analog-to-digital converter (ADC) 17, which provides a digital representation of the output voltage $V_{out}$, i.e. the drive voltage signal $V_{DR}$ and/or the sensed voltage $V_{Sens}$ to the controller 50.

The communication interface 19 may comprise a serial peripheral interface (SPI), which implements a communication protocol that enables an external microcontroller (or other device, for example, a computer) to send/receive information to/from the piezo-electric transducer circuit 2 via the controller 50, such as a reference waveform and internal settings used for the particular implementation. It should be noted SPI is an example of one of several digital communication protocols that may be implemented to interface with the controller 50. Other examples of a communication interface include, but are not limited to I2C, TDM, and I2S.

The inductor $L_1$, may be a 10 μH inductor. The inductor $L_1$ value may be selected in order to: (1) achieve a target distortion, e.g. lower inductance increases switching frequency and decreases distortion/THD+N, and/or (2) minimize the switching frequency, e.g. in general, a lower switching frequency corresponds to lower power consumption.

The first and second switches $Q_1$ and $Q_2$ may be of the same type, which may be the most practical choice for an integrated circuit (IC) implementation, although embodiments with mixed switches may be used. The first and second switches $Q_1$ and $Q_2$ may comprise, for example, GaN, PMOS, among other possible switches.

The output stage 6 may be referenced to the input voltage $V_{in}$ instead of GND. The output stage 6 may include the filter 8, e.g. a capacitor $C_{HV}$, and the load 15, for example one or more of the piezo-electric transducers $P_1$. Therefore, to obtain 0 V differential across $P_1$, the drive voltage $V_{DR}$ and the input voltage $V_{in}$ may be equal. Increasing the drive voltage $V_{DR}$ across the load 15 above the input voltage $V_{in}$ may be provided by the power converter circuit 18 of the driver stage 4.

In the piezo-electric transducer system 1 illustrated in FIG. 3, the conversion ratio, e.g. voltage amplification, of the power conversion circuit 18 may be greater than 10×, and preferably between 10× and 20× for a 50 to 120 $V_{AC}$ drive voltage $V_{DR}$ from a, e.g. 3.6-5 VDC input voltage $V_{in}$. Initially, the controller 50 turns the first switch $Q_1$ on and the current in the inductor $L_1$, which is connected to reference node 20, e.g. ground, ramps up linearly. When the controller 50 turns the first switch $Q_1$ off, the voltage $V_{SW}$ at the switching node SW increases the drive voltage $V_{DR}$ to the desired output voltage $V_{out}$ value and current flows from the inductor $L_1$ through the second diode $Q_2$ to increment the output voltage $V_{out}$. Here, a body diode of the second switch $Q_2$ may turn on or the second switch $Q_2$ may turn on connecting the switching node SW to the load 15 and charges the load 15, e.g. the piezo $P_1$. When the inductor $L_1$ current reaches 0, the second switch $Q_2$ is turned off and the switching node voltage $V_{SW}$ goes back to 0 V. The controller 50 alternates the state first switch Q1 and the second switch Q2 to control the amount of energy sent or extracted from the load 15. In the power converter circuit 18 of the driver stage 4, since the boost converter voltage gain is most of the time larger than 2, the switching node voltage $V_{SW}$ may decrease to a little bit less than 0 V and turns on the body diode of the first switch $Q_1$. Thereupon, the first switch $Q_1$ is turned on again under zero voltage switching condition (ZVS), thus reducing the switching losses associated to the parasitic capacitance at the switching node SW.

When the second switch $Q_2$ turns off, the first switch $Q_1$ turns on in ZVS condition. Then the first switch $Q_1$ stays on until the inductor $L_1$ accumulates enough energy to charge the switch node voltage $V_{SW}$ to the drive voltage $V_{DR}$. When the first switch $Q_1$ turns off, the switch node voltage $V_{SW}$ rings to the drive voltage $V_{DR}$ and the second switch $Q_2$ is turned on under ZVS condition thus reducing switching losses.

An issue with the piezo-electric transducer system 1 is an inability to accurately sense negative voltages across the piezo-electric transducer $P_1$, which are limited by a leakage or turn-on voltage $V_{to}$, e.g. −0.3V, of a parasitic conduction path, e.g. a body diode, of at least one of the drive switches $Q_{DR}$, e.g. the second switches $Q_2$. When the sensed voltage $V_{Sens}$ across the piezo-electric transducer $P_1$ makes $V_{Sens}$−$V_{sw}$ become less than the turn-on voltage $V_{to}$ set by the leakage of the body diode in the drive switch $Q_{DR}$, e.g. the second switch $Q_2$, the output voltage $V_{out}$ read by the controller 50 is limited approximately to that turn-on voltage $V_{to}$ because all other charges created by the piezo-electric transducer $P_1$ are replaced by the body diode conduction which limits the change in voltage.

Figure 4:
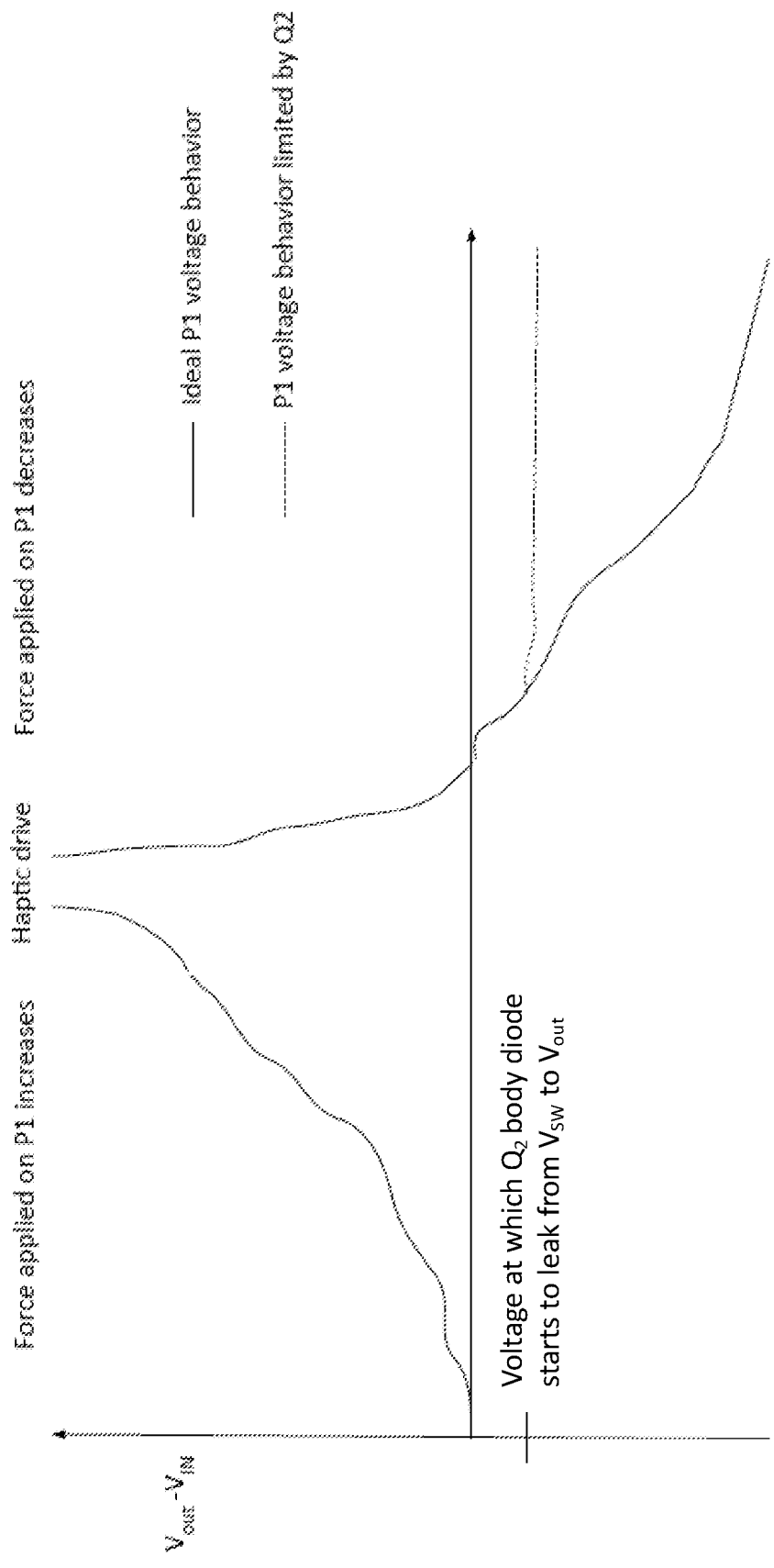
FIG. 4 is a plot of output voltage vs time for the piezo-electric transducer system of FIG. 3 without executing the sense/drive algorithm.

With reference to FIG. 4, an initial application of a force on the piezo $P_1$ results in the generation of a gradually increasing, e.g. positive, sensed voltage $V_{Sens}$ across the piezo $P_1$ and the output voltage $V_{out}$ read by the controller 50 following the sensed voltage $V_{Sens}$, i.e. increasing from zero to a maximum voltage, e.g. 2.0 V. When the sensed voltage $V_{Sens}$ reaches the activation level, e.g. 1.8 V, a drive voltage $V_{DR}$ is forced on the piezo-electric transducer $P_1$ to generate a haptic feedback event increasing the output voltage $V_{out}$ by the drive voltage $V_{DR}$, e.g. to over 50 V. The haptic event terminates by setting the voltage across $P_1$ to 0 V. However, releasing the force or pressure on the piezo $P_1$ now generates a gradually decreasing sensed voltage $V_{Sens}$ and output voltage $V_{out}$, which may become a negative voltage less than the turn on voltage $V_{to}$, e.g. −0.3 V, of the body diode of one of the drive switches $Q_{DR}$, e.g. the second switch $Q_2$. Unfortunately, at lower voltages, i.e. larger negative voltages, the sensed voltage $V_{Sens}$ across the piezo $P_1$ becomes less than an upper limit set by the leakage or turn on voltage $V_{to}$ of the body diode in the second switch $Q_2$, and the output voltage $V_{out}$ read by the controller 50 is limited to that upper limit voltage because all other charges created by the piezo $P_1$ are replaced by the body diode conduction which limits the change in measured output voltage $V_{out}$.

Figure 5:
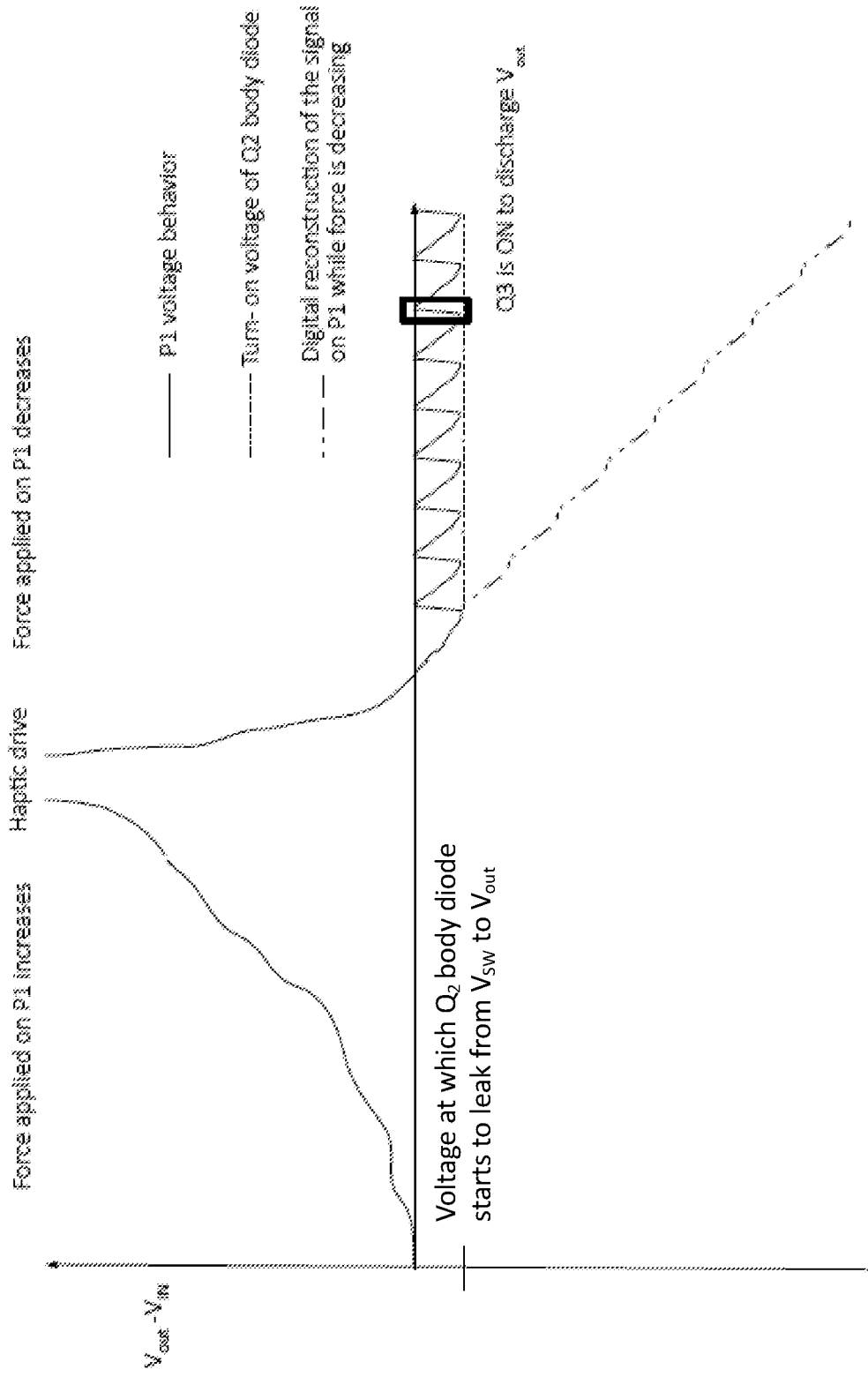
FIG. 5 is a plot of output voltage vs time for the piezo-electric transducer system of FIG. 1 or 3 while operating the sense/drive algorithm.

FIG. 5 illustrates a typical use case for a haptic system relative to the base architecture with the addition of the sensing switch, e.g. sensing transistor, $Q_S$, which may be in the form of an existing driver stage switch, e.g. $Q_{DR2}$ (FIG. 1), an added sensing switch $Q_S$ (FIG. 1), or a third switch, e.g. transistor, $Q_3$ (FIG. 3) to enable the sense/drive algorithm 10 to be executed by the controller 50. The sensed voltage signal $V_{Sens}$ across the load 15, e.g. piezo-electric transducer $P_1$, increases normally in the positive direction when a user applies a force on the piezo-electric transducer $P_1$ until the sensed voltage $V_{Sens}$ reaches the activation level set to launch a haptic effect. When the activation level is reached, the different driver stage switches $Q_{DR}$, e.g. the first and second switches $Q_1$ and $Q_2$, are biased by the controller 50 to generate the high-voltage drive voltage signal $V_{DR}$ on the piezo-electric transducer $P_1$. The piezo-electric transducer $P_1$ transforms the drive voltage signal $V_{DR}$ into a displacement or force via the piezo-electric transducer $P_1$ that is felt by the user. The sensed voltage signal $V_{Sens}$ on the piezo-electric transducer $P_1$ is driven back to 0 at the end of the haptic effect using at least one of the driver stage switches, e.g. $Q_2$. Then when the user removes the force from the piezo-electric transducer $P_1$, the sensing voltage signal $V_{Sens}$ across the piezo-electric transducer $P_1$ becomes negative. Accordingly, the sense/drive algorithm 10 may be used by the controller 50 to obtain an accurate representation, e.g. digital value, of a total sensed voltage $V_{SensT}$, pieced together from segments of the output voltage signal $V_{out}$, e.g. the sensed voltage $V_{Sens}$, which are continually sensed, e.g. 1 kS/s-10 kS/s, providing a current interim digital representation at each sample, and then repeatedly discharged by the sensing switch $Q_S$ providing a full segment digital representation each discharge, whenever the output voltage, i.e. the sensed voltage $V_{Sens}$, approaches the turn on voltage of the parasitic conduction path, e.g. every 2-4 ms. While it is not depicted in FIG. 5, once the sensed voltage signal $V_{Sens}$ or $V_{SensT}$ reaches the activation level, e.g. less than −1.8 V, or a magnitude (absolute value) greater than the magnitude (absolute value) of the activation level value, a following haptic effect may be triggered.

The sensing switch, e.g. sensing transistor $Q_S$, comprised of the third switch $Q_3$ may be connected between the piezo-electric transducer $P_1$ and the reference voltage, e.g. $V_{ref}$, $V_{in}$ or ground, with the control terminal, e.g. gate, connected to the controller 50, which enables the output voltage $V_{out}$, e.g. the sensed voltage $V_{Sens}$, across the piezo-electric transducer $P_1$ to be zeroed, i.e. discharged to the reference voltage, when needed. Accordingly, the third switch $Q_3$ may be activated by the controller 50 to zero the output voltage $V_{out}$, e.g. the sensed voltage $V_{Sens}$ across the piezo-electric transducer $P_1$, each time the output voltage $V_{out}$ approaches a trigger level of a parasitic conductive path, e.g. the turn-on voltage, (−0.3 V) of the body diode of the second switch $Q_2$. As a result, each time the output voltage $V_{out}$ based on $V_{Sens}$ reaches a threshold voltage $V_{th}$, e.g. −0.25 V, at some level greater than the negative turn-on voltage, (or less than a positive turn-on voltage) a full voltage segment is generated and converted into a digital value by the controller 50, added to an accumulated sensed voltage value $V_{acc}$, and then discharged by activation of the sensing switch $Q_S$. A plurality of voltage segments, e.g. having a magnitude approximately the same as the threshold voltage (0.25 V) but usually greater depending on sample rate, are sequentially generated and then discharged. The sense/drive algorithm 10 executed by the controller 50 may determine, e.g. provide a reconstruction (digital) of, the sensed voltage $V_{Sens}$ across the piezo-electric transducer $P_1$ from the plurality of voltage segments and, when accuracy is essential, the interim digital representation from the current sensed voltage $V_{Sens}$, forming a digital value representing a total accumulated sensed voltage $V_{SensT}$. For example: the sense/drive algorithm executed by the controller 50 may add up (digitally) the different voltage segments (See FIG. 5) of the output voltage $V_{out}$ or add up (digitally) the number of times the output voltage $V_{out}$ moves between 0 and the threshold voltage $V_{th}$, thus providing a much better sensing performance for negative voltages across the piezo-electric transducer $P_1$. Accordingly, the controller 50 may be able to determine when the user has fully released the piezo-electric transducer $P_1$ and/or set a more accurate minimum negative voltage for resetting and determining a secondary force application, e.g. greater in magnitude than the activation level, on the piezo-electric transducer $P_1$. While the architecture in FIG. 3 required the addition of the sensing switch $Q_S$, e.g. the third switch $Q_3$, to be able to implement the sense/drive algorithm 10, some architectures may not need an extra component, e.g. switch, to be added to implement the method, but a change in the control algorithm utilizing an existing component, e.g. switch, may be sufficient.

Figure 6:
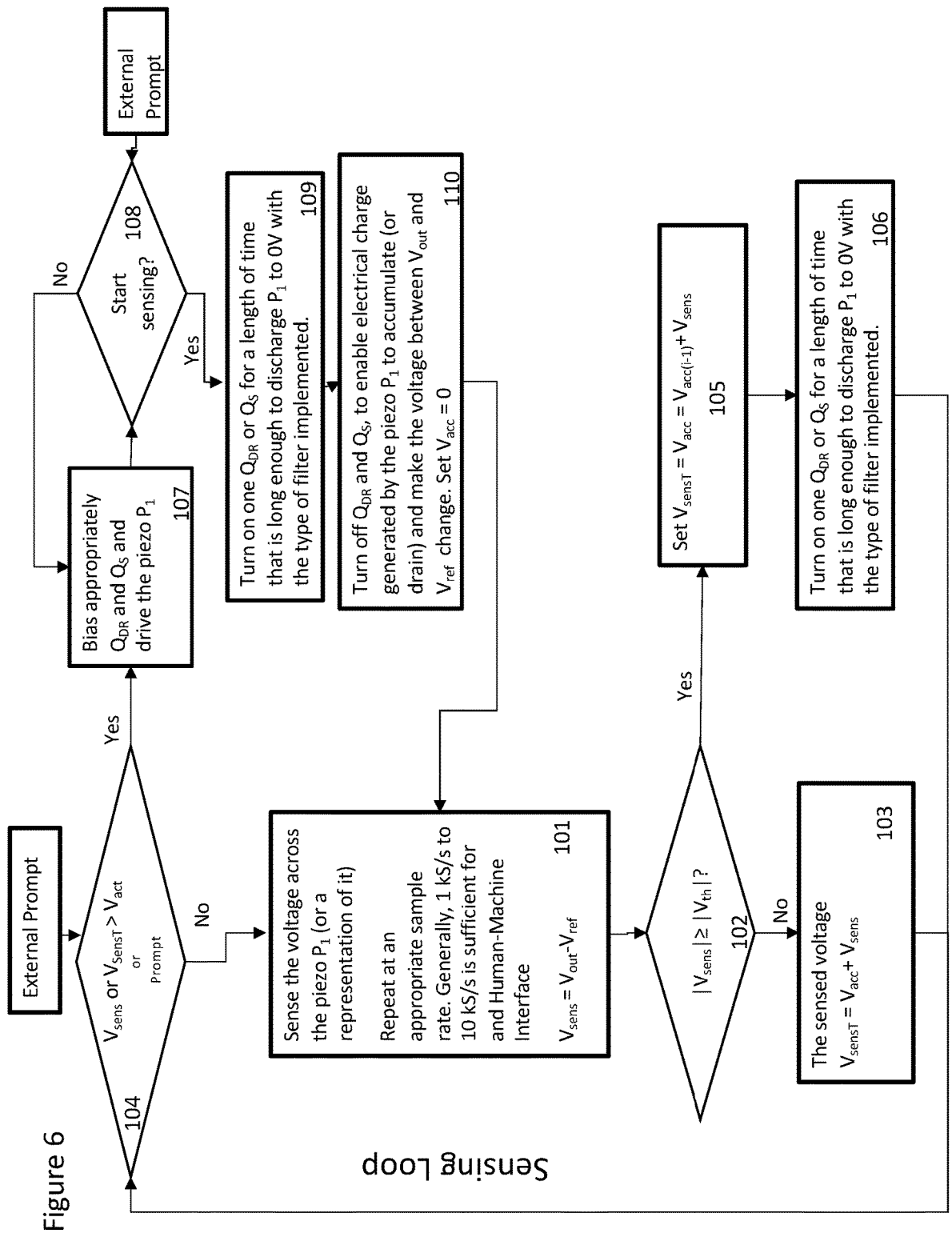
FIG. 6 is a flow chart of an algorithm for controlling a piezo-electric transducer.

With reference to FIG. 6, the controller 50 may execute the sense/drive algorithm 10 in the following manner. During normal operation, the controller 50 is executing the sensing loop including sensing step 101, preferably at a typical rate between one thousand samples per second and ten thousand samples per second (1 kS/s and 10 kS/s) for applications in Human-Machine Interfaces generating interim digital representations of the current sensed voltage $V_{Sens}$. Before entering the sensing loop, the first piezo-electric transducer $P_1$ is connected to the reference voltage $V_{ref}$ on one side, e.g. $V_{in}$, with the driver stage switches $Q_{DR}$ and the sensing switches $Q_S$ switched off creating a high impedance node 13, and enabling the controller 50 to continuously determine the output voltage $V_{out}$, comprised of only the sensed voltage $V_{Sens}$ i.e. for sensing a force application on the piezo-electric transducer $P_1$. In step 101, the sensed voltage $V_{Sens}$ across $P_1$ ($V_{out}$−$V_{ref}$) is sensed. The value of the accumulated voltage $V_{acc}$ is initially set to 0V, and the controller 50 senses and receives an interim digital representation of the sensed voltage $V_{Sens}$ at the aforementioned sample rate, e.g. every 0.1 to 1 ms.

Figure 8:
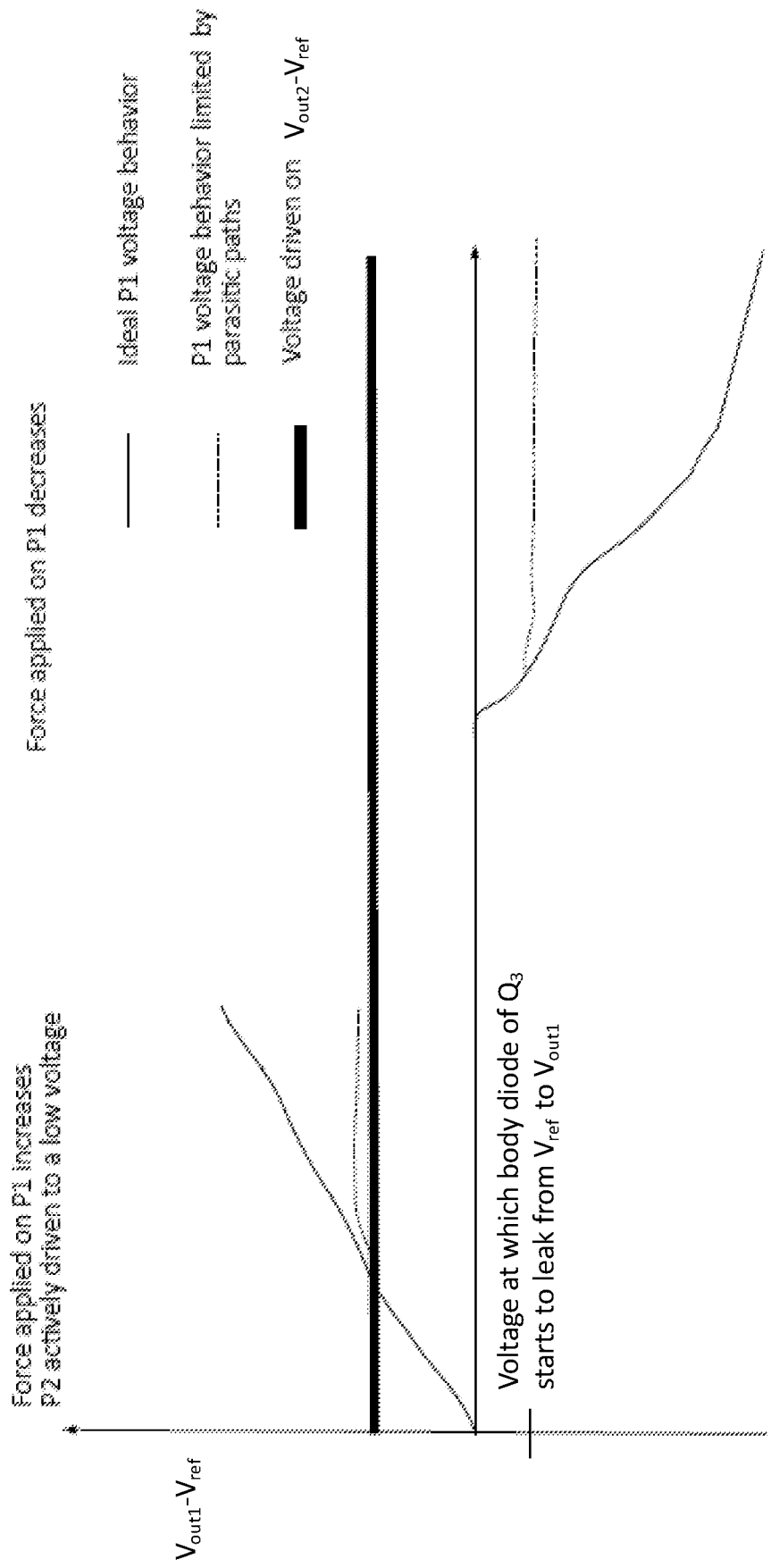
FIG. 8 is a plot of voltage vs time for a piezo-electric sensing voltage for a conventional multi-channel piezo-electric transducer system.

In decision step 102, the controller 50 determines if the voltage across the piezo-electric transducer $P_1$ is approaching the trigger level of any one of the parasitic paths in the circuit, by, e.g. determining if the sensed voltage $V_{Sens}$ is above the threshold voltage $V_{th}$ or between the threshold voltage $V_{th}$ and the turn-on voltage $V_{to}$ of some or all of the parasitic paths. As shown in FIG. 5, a single parasitic path existed in the implementation of FIG. 3 when the sensed voltage $V_{Sens}$ across the piezo $P_1$ was becoming negative enough. However, FIGS. 1 and 8 show cases in which an upper bound and a lower bound on the sensed voltage $V_{Sens}$ across the piezo $P_1$ may trigger parasitic paths. Consequently, decision step 102 verifies if a parasitic path will be triggered by the current sensed voltage $V_{Sens}$ across the piezo $P_1$. While the decision shows a single condition, in a real application, multiple conditions may be tested. If none of the conditions are true, i.e. the sensed voltage $V_{Sens}$ across the piezo $P_1$ is not close to triggering a parasitic path, the algorithm 10 proceeds to totalling step 103, in which the total sensed voltage $V_{SensT}$ is equal to the sum of the current value of the accumulated voltage $V_{acc}$ (result of accumulation step 105 as hereinafter described or 0 V if no parasitic path previously triggered) plus the current measured sensed voltage $V_{Sens}$ across the piezo $P_1$, as per the current sample, i.e. the interim digital representation. The sensing loop then proceeds to comparison step 104, where the value of the sensed voltage $V_{Sens}$ or the total accumulated sensed voltage $V_{SensT}$ is compared to one or more arbitrary activation level(s). Depending on the result of the comparison step 104, the algorithm 10 may continue in the sensing loop until the total accumulated sensed voltage $V_{SensT}$ reaches the activation level or the algorithm 10 exits the sensing loop to drive the driver stage 4 and the piezo $P_1$, in driver step 107, as hereinafter described.

Figure 9:
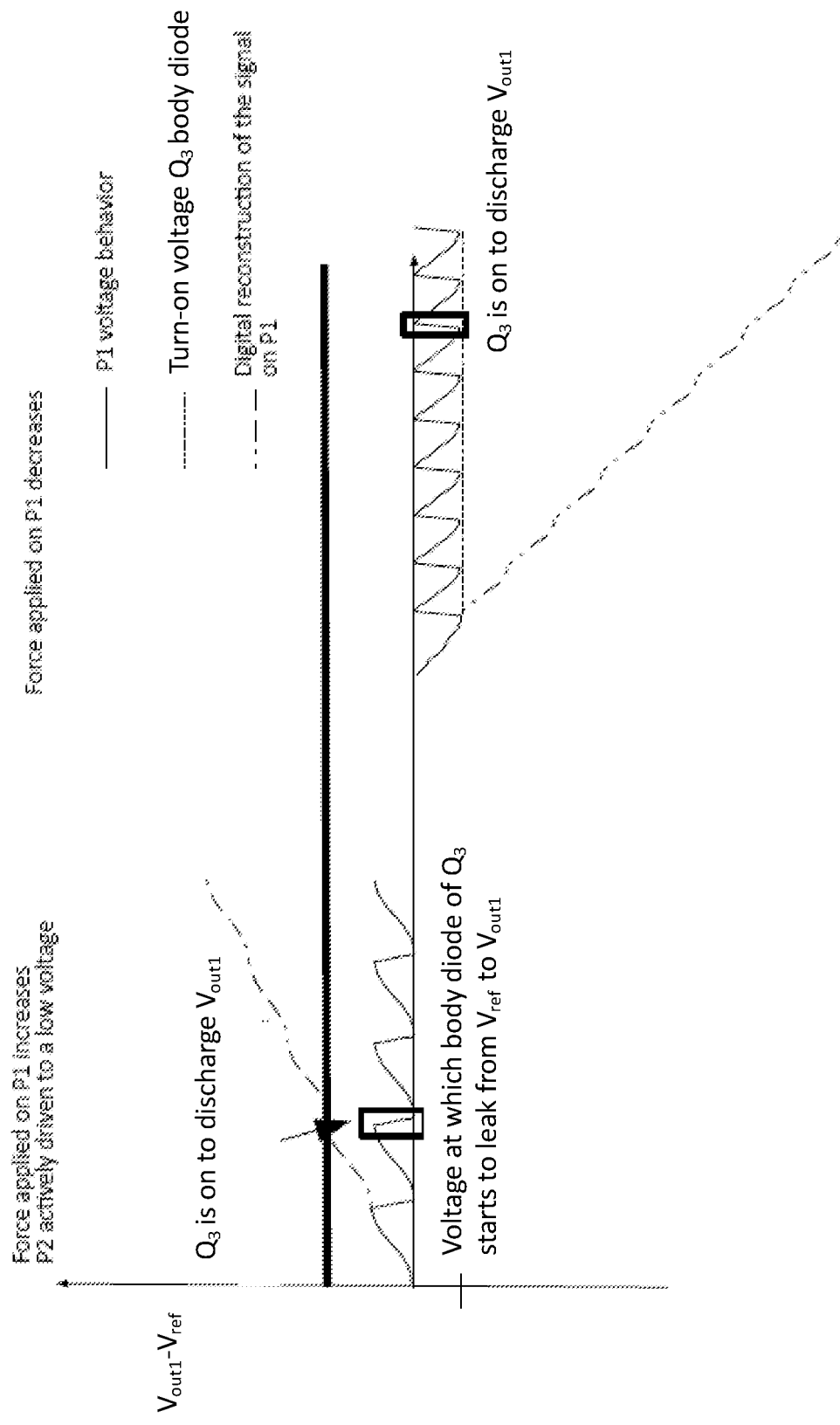
FIG. 9 is a plot of voltage vs time for a piezo-electric sensing voltage for the multi-channel piezo-electric transducer system of FIG. 7.

While the algorithm 10 cycles through the sensing loop, one of the conditions, i.e. trigger a parasitic path, at the decision step 102 may become true. When that happens, the algorithm 10 will proceed to accumulation step 105. The value of the accumulated voltage $V_{acc}$ will be updated as $V_{acc}$ to the sum of the current sensed voltage $V_{Sens}$ (or $V_{out}$−$V_{ref}$) measured across the piezo $P_1$ based on the current sample (current interim digital representation), and the current value of the accumulated voltage $V_{acc}$ based on the number of previously discharged sensed voltages $V_{Sens}$ (digital representation of voltage segments). When the algorithm 10 enters the sensing loop, the value of the accumulated voltage $V_{acc}$ is always 0 and its value is updated every time it goes through the accumulation step 105 so that the controller 50 may determine the total accumulated sensed voltage $V_{SensT}$ generated by the piezo-electric transducer $P_1$ as depicted in FIG. 5 and FIG. 9. The accumulation Step 105 is a special case in which the total accumulated sensed voltage $V_{SensT}$ equals the new accumulated voltage $V_{acc}$. Then in discharge step 106, the sensing switch (e.g. $Q_{DR}$ or $Q_S$) is used to discharge the voltage across the piezo $P_1$ to 0V. The sensing switch $Q_S$ is turned on long enough to ensure a proper discharge with the filter that may be implemented. In comparison step 104, after each sample, when the controller 50 senses a total accumulated sensed voltage $V_{SensT}$, which may be an accumulated voltage $V_{acc}$+a current sensed voltage $V_{Sens}$, i.e. an interim digital representation thereof, greater than the activation level, i.e. a force application on the piezo $P_1$ of large enough magnitude, OR when an external prompt is sent from the host device at decision step 102, the controller 50 switches to driver step 107.

In driver step 107, the controller 50 may activate the drive voltage $V_{DR}$ with the driver stage switches $Q_{DR}$ and the sensing switches $Q_S$ properly biased, to generate a haptic response in response to a force application on the piezo $P_1$ or some other notification. During the driving step 107 the driver stage switches $Q_{DR}$, e.g. the first and second switches $Q_1$ and $Q_2$, and the sensing switching $Q_S$, the third switch $Q_3$, are biased appropriately by the controller 50 to drive the first piezo-electric transducer $P_1$ to generate a haptic response to the user, e.g. some form of notification from the device, such as a force application on the piezo $P_1$ or in response to an external notification, e.g. a telephone call. With reference to repeat step 108, at the end of the haptic effect, the sense/drive algorithm 10 may repeat the driving step 107, if for example an external prompt from the host device requires another haptic response or may revert back to the sensing loop and wait for a user or device input. Prior to returning to the sensing loop at step 101 the controller 50 may execute first and/or second reset steps 109 and 110 by first turning on the sensing switches $Q_S$ and or driver stage switches $Q_{DR}$ to discharge the output voltage $V_{out}$ across the piezo $P_1$, e.g. to 0V (step 109) and then by turning off the driver stage and sensing switches $Q_{DR}$ and $Q_S$ at reset step 110, to enable electrical charge generated by the piezo $P_1$ to accumulate (or drain) and make the voltage between the output node 13 ($V_{out}$) and the reference voltage $V_{ref}$, e.g. $V_{IN}$, change, so that the controller 50 accurately receives the output voltage $V_{out}$ indicative of the sensed voltage signal $V_{Sens}$ across the first piezo $P_1$.

To avoid parasitic leakage, the controller 50 may determine when the output voltage $V_{out}$ is between the threshold voltage $V_{th}$ and the turn on voltage $V_{to}$ for each switch, e.g. transistor, connected to the piezo $P_1$, e.g. driver stage switches $Q_{DR}$. For example, for negative voltages, the controller 50 may determine when the output voltage $V_{out}$ is less than the threshold voltage $V_{th}$. For positive voltages, the controller 50 may determine when the output voltage $V_{out}$ is greater than the threshold voltage Vat. Alternatively, the controller 50 may determine when the magnitude (or absolute value) of the output voltage $|V_{out}-V_{ref}|$ is greater than the magnitude (or absolute value) of the threshold voltage $|V_{th}|$. With reference to FIG. 3, the threshold voltage $V_{th}$ (e.g. −0.25 V) corresponds to a voltage greater than the turn on voltage $V_{to}$ (e.g. −0.3 V) of the second switch $Q_2$.

With reference to FIG. 1, the decision step 102 may be applied with the proper threshold voltage $V_{th}$ and turn on voltages $V_{to}$ for all the driving switch $Q_{DR}$ or at least some of them, e.g. the driving switches ($Q_{DR1}$, $Q_{DR2}$, $Q_2$) directly connected to the piezo $P_1$ or the driving switch $Q_{DR}$ with the turn on voltage $V_{th}$ with the lowest magnitude or highest value. In more general terms, decision step 102 asks if the output voltage $V_{out}$ value approaches a value which would trigger an existing parasitic path in the piezo-electric transducer circuit 2. The number of parasitic paths in the piezo-electric transducer circuit 2 may vary. In the embodiment of FIG. 1 there are 2 paths, e.g. $Q_{DR1}$ and $Q_{DR2}$, in the embodiment of FIG. 2b, there are 4 parasitic paths, e.g. $Q_{DR1+}$, $Q_{DR1-}$, $Q_{DR2+}$ and $Q_{DR2-}$, and in the embodiment of FIG. 3 there is 1 parasitic path, e.g. $Q_2$.

When the answer to decision step 102 is YES for at least one tested parasitic path, an accumulated voltage $V_{acc}$ is computed by the controller 50 at accumulation step 105 as the sum of the previous accumulated voltage $V_{acc(i-1)}$ plus the current voltage segment, i.e. $(V_{out}-V_{ref})_i$, each voltage segment may approximately equal to or slightly larger than the magnitude of the threshold voltage $V_{th}$. Each voltage segment is converted into a digital representation, which are added up by the controller 50. The total reconstructed voltage $V_{SensT}$ in that situation may be equal to the sum of the digital representations of the voltage segments plus the digital representation of the current voltage segment, $V_{Sens}$ or $(V_{out}-V_{ref})$.

Each time the sensed voltage $V_{Sens}$ ($V_{out}-V_{ref}$) reaches a parasitic condition in decision step 102 and the accumulation step 105 is executed, a discharge step 106 may be executed by the controller 50, during which the controller 50 turns on at least one of the sensing switches $Q_S$, e.g. the second driver switch $Q_{DR2}$ or the third switch $Q_3$, and zeroes, e.g. discharges, the output voltage $V_{out}-V_{ref}$ to 0 V therethrough. The sense/drive algorithm 10 then proceeds to repeat the decision step 102, at a repetition rate faster than the change in force on the first piezo $P_1$, which will typically occur over several milliseconds. Accordingly, in a digital system, the sensing loop may be repeated, a new sampled sensed voltage $V_{Sens}$ obtained along with a new interim digital representation and a new total sensed voltage $V_{SensT}$, every 100 µs to 1 ms to get a good sensing performance in a Human-Machine Interface.

When the answer to decision step 102 is NO for all parasitic paths or at least the one or more tested parasitic paths, e.g. with the lowest magnitude or highest value turn on voltage $V_{to}$, the reconstructed or total accumulated sensed voltage $V_{SensT}$ is computed by the controller 50 during a determination step 103 as the sum of the accumulated voltage $V_{acc}$ and the current voltage segment, i.e. $(V_{out}-V_{ref})$ of the sensed voltage $V_{Sens}$. The value of the total accumulated sensed voltage $V_{SensT}$ represents the voltage that would be at output voltage $V_{out}$ at the output node 13, if no parasitic path exist in the driver stage 4.

A specific example of the sense/drive algorithm 10 comprise a sensing loop, wherein the piezo $P_1$ continues to sense a force application, until decision step 104 determines whether the total accumulated sensed voltage $V_{SensT}$ is greater than the activation level or the host device sends an external prompt, which will result in the controller 50 activating the driver stage 4, step 107, e.g. bias driver stage switches $Q_1$ and $Q_2$, to generate and transmit the driver voltage $V_{DR}$ to the piezo $P_1$. At the end of the voltage waveform applied on the piezo $P_1$, e.g. a single cycle of a sine waveform with a frequency of 200 Hz and 50V amplitude, then the system returns to the sensing loop. One of the driver stage switches $Q_{DR}$ or the sensing switches $Q_S$ may turn on long enough to discharge the piezo $P_1$, e.g. to 0V, at step 109, and then the driver stage switches $Q_{DR}$, e.g. the first and second switches $Q_1$ and $Q_2$, may be turned off to enable electrical charge generated by the piezo $P_1$ to accumulate, and thereby make the voltage between the output voltage $V_{out}$ and the reference voltage $V_{ref}$ increase and/or decrease with force applications on the piezo $P_1$, as step 110.

When the original force application continues, e.g. during the release of the force, or during a second consecutive force application, the controller 50 determines if the output voltage $V_{out}$, i.e. the output voltage $V_{out}$ minus the reference voltage $V_{ref}$, representative of the sensed voltage $V_{Sens}$, is approaching the parasitic leakage condition in step 102. In other words whether the output voltage $V_{out}$ is a large enough negative voltage to overcome the leakage or turn-on voltage $V_{to}$ of the body diode in one of the driver stage switches $Q_{DR}$, e.g. the second switch $Q_2$, by determining if the output voltage $V_{out}$ is greater than a predetermined threshold voltage $V_{th}$ of at least one of the driver stage switches $Q_{DR}$, e.g. the second switch $Q_2$, which is less than the leakage voltage $V_{to}$. If the sensed voltage $V_{Sens}$ and therefore the output voltage $V_{out}$ reaches the threshold voltage $V_{th}$, e.g. −0.5V, then (step 105) the controller 50 adds the voltage segment of the output voltage $V_{out}$ between 0 and approximately the threshold voltage $V_{th}$ typically, just above the threshold voltage $V_{th}$, to an accumulated voltage $V_{acc}$ in step 105. The sensing switch $Q_S$, e.g. the third switch $Q_3$, is turned on (step 106) by the controller 50 for a length of time, which is long enough to discharge the first piezo $P_1$ to 0V. The accumulation process may be repeated (step 105) at a rate faster than the change in force on the first piezo $P_1$, which will typically occur over several milliseconds, e.g. every 1000 samples per second (1 kS/s) to 10000 samples per second (10 kS/s). During each sample, if the threshold voltage $V_{th}$ is not met, then the total sensed voltage $V_{SensT}$ may be calculated (step 103) by the controller 50 to be the accumulated voltage $V_{acc}$ plus the current reference voltage segment value $V_{Sens}$, i.e. $V_{out}$ minus the reference voltage $V_{ref}$, which may be 0 (for ground).

Figure 7:
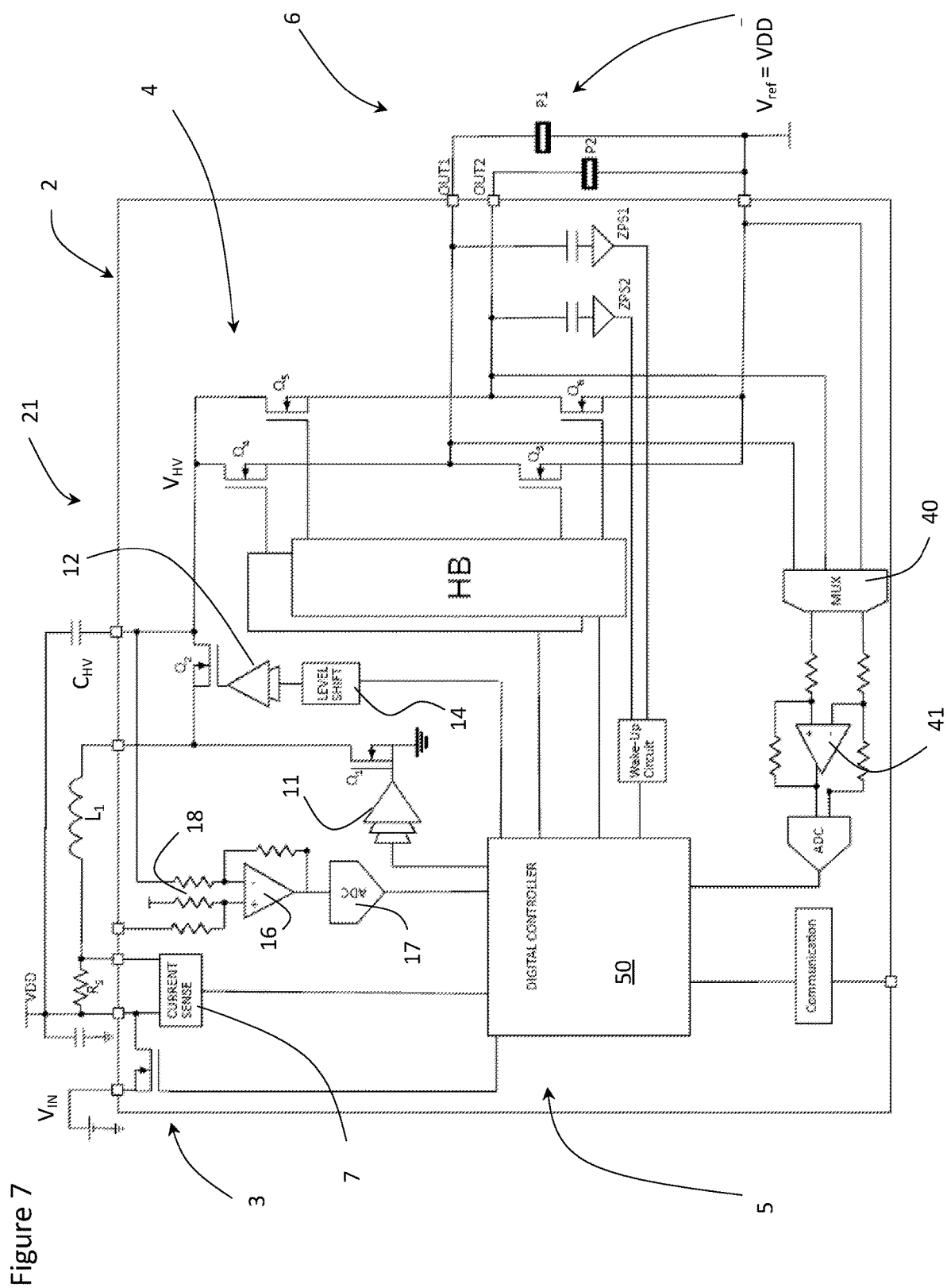
FIG. 7 is a schematic diagram of a multi-channel piezo-electric transducer system in accordance with another embodiment of the present disclosure.

With reference to FIG. 7, a single driver circuit may be utilized to independently drive multiple loads 15, each comprising a plurality of piezo-electric transducers, e.g. $P_1$ and $P_2$ in the illustrated embodiment. The piezo-electric transducer system 21, includes the piezo-electric transducer circuit 2 comprising the input stage 3, the driver stage 4, which may include a power converter circuit, the amplifier bias/switch control 5, and the output stage 6. The piezo-electric transducer system 21 may be implemented in a single chip or using discrete parts due to the high power to process. The input stage 3 may be connected to a voltage source, such as a battery, typically generating an input voltage $V_{in}$ of between 2 V and 10 V, preferably 3.6 V to 5V. The driver stage 4, as described hereinbefore may be a forward-boost/reverse-buck converter that generates a clean sine waveform, as described herein before. The converter stage 4 may include the inductor $L_1$ connected to the voltage source $V_{IN}$, and the one or more driver stage switches $Q_{DR}$, e.g. the first low side switch $Q_1$ connected between the inductor $L_1$ and ground, and the second switch $Q_2$ connected between the inductor $L_1$ and the output stage 6. The control terminal, e.g. gate, of the transistor in the first switch $Q_1$ may be connected to the first gate driver 11, and the control terminal, e.g. gate, of the transistor in the second switch $Q_2$ may be connected to the second gate driver 12. Both the first gate driver 11 and the second gate driver 12 may be connected to the controller 50, which sends control signals to the first and second gate drivers 11 and 12 to control operation of the driver or power converter switches $Q_{DR}$, e.g. the first and second switches $Q_1$ and $Q_2$, respectively, as described hereinbefore.

The input stage 3 may include the filter capacitor ($C_{HV}$) connected across the low voltage source $V_{IN}$ and the high voltage waveform $V_{HV}$, and the sense resistor ($R_S$) connected between the low voltage source $V_{IN}$ and the single inductor $L_1$. The single inductor $L_1$ may be connected between the sense resistor $R_S$ and a switching node SW of the power converter circuit of the driver stage 4. As above, the current sensor 7 may be connected on both sides of the sense resistor $R_S$ and to the controller 50 for measuring the current, and/or the voltage entering the inductor $L_1$ and the power converter circuit of the driver stage 4.

The one or more driver stage switches $Q_{DR}$ may include a fourth (or first piezo-selecting) switch $Q_4$ connected between the second switch $Q_2$ and the first piezo $P_1$, which may be activated by the controller 50 to independently control the charging/discharging of the first piezo $P_1$, and a fifth (or second piezo-selecting) switch $Q_5$ connected between the second switch $Q_2$ and the second piezo $P_2$, which may be activated by the controller 50 to independently control the charging/discharging of the first and second piezo-electric transducers $P_1$ and $P_2$, respectively, during haptic drive thereof. Zero power wake-up sensing mechanisms $ZPS_1$ and $ZPS_2$, as disclosed in U.S. patent application Ser. No. 16/136,347 filed Sep. 20, 2018 in the name of Boreas Technologies, Inc., which is incorporated herein by reference, may be provided to wake up the piezo-electric transducer system 21, in particular the first piezo-electric transducer $P_1$ or the second piezo-electric transducer $P_2$, based on a force applied to, and resulting voltage signals received from, the first piezo-electric transducer $P_1$ or the second piezo-electric transducer $P_2$.

The sensed voltage $V_{Sens1}$ or $V_{Sens2}$ generated by the first and/or second piezo-electric transducers $P_1$ and $P_2$, respectively, may often exceed the turn on voltage levels of the body diodes of the driver stage switches $Q_{DR}$ or the sensing switches $Q_S$. Because of the parasitic paths via the driver stage switches $Q_{DR}$, e.g. the fourth switch $Q_4$ and the fifth switch $Q_5$ and/or the sensing switches $Q_3$ and $Q_6$, a voltage difference between the two ends of each piezo-electric transducer $P_1$ and $P_2$ will develop when a change in force occurs thereon. When the output voltage $V_{out1}$ or $V_{out2}$ representing the sensing voltage $V_{Sens1}$ or $V_{Sens2}$ goes above the leakage or turn on voltage of the parasitic diodes of one or more of the driver stage switches $Q_{DR}$ or sensing switches $Q_S$, current will start to flow in the diodes of the driver stage switches $Q_{DR}$ and/or the sensing switches $Q_S$ which will limit the output voltage signal $V_{out}$ available to the controller 50 based on the sensed voltage $V_{Sens1}$ or $V_{Sens2}$ from the piezo-electric transducers $P_1$ or $P_2$ to measure the change of force applied thereto. For example, anytime the output voltage (or the sensed voltage $V_{Sens1}$ or $V_{Sens2}$):

$$(V_{out1} \text{ or } V_{out2}) - V_{HV} > V_{to} (\sim 0.3V), \text{ e.g. for driver stage switches } Q_4 \text{ and } Q_5, \text{ OR}$$

$$(V_{out1} \text{ or } V_{out2}) - V_{ref} < V_{to} (\sim -0.3V), \text{ e.g. for sensing switches } Q_3 \text{ and } Q_6,$$

there may be a triggering of a parasitic path. There are numerous situation when this may happen, e.g. the driver stage 4 may be driving 0V across the second piezo-electric transducer $P_2$ while the first piezo-electric transducer $P_1$ is sensing a force application creating the first sensing voltage signal $V_{Sens1}$ higher than 0.3V, which would trigger the parasitic path in the driver stage switch $Q_4$.

FIG. 8 illustrates the issue using the simple case of FIG. 7. When a change of force on the first piezo-electric transducer P1 generates a first sensed voltage VSens1 across the piezo-electric transducer P1 with an amplitude that is high enough to trigger one of the two parasitic diodes in one of the drive switches QDR, e.g. Q4 or Q5, then the first output voltage Vout1 based on the first sensing voltage VSens1 across the first piezo-electric transducer P1 saturates near the turn on voltage Vto of one of the drive switches QDR instead of being proportional to the force applied on the first piezo-electric transducer P1. In simple terms, once the parasitic diodes of one of the drive switches QDR saturates the first output voltage Vout1 based on the first sensing voltage VSens1, the first piezo-electric transducer P1 becomes insensitive to further change in force in the same direction.

For example, with reference to FIG. 8, for a conventional multi-piezo system, during an initial force application on the first piezo-electric transducer $P_1$, a positive sensed voltage $V_{Sens1}$ will develop on the first piezo $P_1$ between $OUT_1$ and $V_{ref}$. Assuming the driver stage 4 doesn't drive any signal, the sense voltage $V_{Sens1}$ will develop normally in response to a force application, as in FIG. 5. However, if it happens that a second drive voltage signal $V_{DR2}$ is applied on the second piezo-electric transducer $P_2$ at the same time, the first sensing voltage signal $V_{Sens1}$ on the first piezo-electric transducer $P_1$ will saturate at various voltages based on the second drive voltage $V_{DR2}$, e.g. at high voltage node $V_{HV}$, on the second piezo-electric transducer $P_2$ because of the body diode in one or more of the drive switches $Q_{DR}$, e.g. $Q_4$. Consequently, it is not possible to read a force applied accurately on the first piezo-electric transducer $P_1$ or the second piezo-electric transducer $P_2$ in this multi-channel architecture when a drive voltage, e.g. $V_{DR1}$ or $V_{DR2}$, is being sent to either of the first and second piezo-electric transducers $P_1$ and $P_2$ via high-voltage node $V_{HV}$.

The sensing switches $Q_S$ may comprise the third switch $Q_3$, which may be connected between the first piezo-electric transducer $P_1$ and a reference voltage $V_{ref}$ with the control terminal, e.g. gate, connected to the controller 50, and a sixth switch $Q_6$, which may be connected between the second piezo-electric transducer $P_2$ and the reference voltage $V_{ref}$ with the gate connected to the controller 50, provide similar functionality as the third switch $Q_3$ in FIG. 3, i.e. enable the controller 50 to independently control the discharge of the first piezo-electric transducer $P_1$ and the second piezo-electric transducer $P_2$ independently of each other in all situations. Accordingly, the third and sixth switches $Q_3$ and $Q_6$ may be activated by the controller 50 to zero the first or second output voltages $V_{out1}$ or $V_{out2}$, respectively, based on the first or second sensed voltages $V_{Sens1}$ or $V_{Sens2}$ across the first piezo-electric transducer $P_1$ or the second piezo-electric transducer $P_2$, respectively, each time the first or second output voltage $V_{out1}$ or $V_{out2}$ approaches the turn-on voltages, e.g. 0.3 V, of the body diodes of the driver stage switches $Q_{DR}$ or sensing switches $Q_S$, e.g. $Q_4$, $Q_5$, $Q_3$ or $Q_6$, i.e. each time the output voltage $V_{out1}$ or $V_{out2}$ reaches a threshold voltage $V_{th1}$ or $V_{th2}$, e.g. +/−0.25 V, which is less than the turn-on voltage $V_{to}$ of the body diode of one or more of the drive switches $Q_{DR}$ and/or sensing switches $Q_S$, e.g. $Q_4$, $Q_5$, $Q_3$ or $Q_6$. A different first threshold voltage $V_{th1}$ may be set for each driver stage switch, e.g. $Q_4$ and $Q_5$, and a different second threshold voltage $V_{th2}$ for each sensing switch $Q_3$ and $Q_6$, or a single threshold voltage $V_{th1}$ may be set for some or all of the piezo-selecting switches and for some or all of the sensing switches.

Typically, when sensing on the first piezo $P_1$, while another action is taking place, e.g. driving the second piezo $P_2$ or continued sensing on the first or second piezo $P_1$, a first (upper) threshold voltage $V_{to1}$ (about 0.2V to 0.4V) is set for the driver stage switch $Q_4$ based on the second driver voltage $V_{DR2}$ at node $V_{HV}$ causing a parasitic trigger, and a second (lower) threshold voltage $V_{to2}$ (−0.2V to −0.4V) is set for the sensing switch $Q_3$ based on the output voltage $V_{out}$ based on sensing voltage $V_{Sens2}$ causing a parasitic trigger. The same is true for the second piezo $P_2$, i.e. $(V_{out})-V_{HV} > V_{to1}$ (~0.3V), e.g. for switches $Q_4$ and $Q_5$ or $(V_{out})-V_{ref} < V_{to2}$ (~−0.3V), e.g. for switches $Q_3$ and $Q_6$.

The algorithm 10 executed by the controller 50 may digitally reconstruct the real accumulated sensing voltage $V_{SensT1}$ or $V_{SensT2}$ across the first piezo-electric transducer $P_1$ and/or the second piezo-electric transducer $P_2$ by adding up the different segments of the output voltage $V_{out}$ moving between 0 and the appropriate threshold voltage $V_{th1}$ or $V_{th2}$, i.e. less than the turn-on voltage $V_{to}$ of the body diode of the one or more of the corresponding drive switches $Q_{DR}$ or corresponding sensing switches $Q_S$, e.g. $Q_4$, $Q_5$, $Q_3$ or $Q_6$ thus providing much better sensing performance for sensing voltages $V_{Sens1}$ and $V_{Sens2}$ across the first and second piezo-electric transducers $P_1$ and $P_2$, which corresponds typically to a release in a touch interface or simultaneous or coincidental driving and/or sensing of the first and second piezo-electric transducers $P_1$ and $P_2$.

To enable independent accurate sensing on all channels, e.g. the first and second piezo-electric transducers $P_1$ and $P_2$, independently of drive activity on other channels zeroing or sensing switches $Q_3$ and $Q_6$ may be activated Accordingly, when a force is applied to the first piezo $P_1$, while a drive signal $V_{DR2}$ is applied to the second piezo-electric transducer $P_2$, (See left side of FIG. 8) the third switch $Q_3$ is used to discharge the first piezo-electric transducer $P_1$ when the output voltage signal $V_{out1}$ based on the first sensing voltage $V_{Sens1}$ of the first piezo $P_1$ reaches either of the threshold voltages $V_{to1}$ or $V_{to2}$, e.g. +/−0.25V, near (less than) the leakage or turn on voltage $V_{to1}$ or $V_{to2}$, e.g. +/−0.3V, at which the body diode of the fourth switch $Q_4$ or the third switch $Q_3$, respectively, would start to pass current. The controller 50 may digitally determine the first total accumulated sensing voltage signal $V_{SensT1}$ of the first piezo-electric transducer $P_1$ from the small segments between 0 V and the corresponding threshold voltages $V_{th1}$ and $V_{th2}$, e.g. one negative and one positive, to provide an accurate representation of the real sensing voltage signal $V_{SensT1}$ from the first piezo-electric transducer $P_1$, as above with reference to FIGS. 1 and 2.

FIG. 9 presents the result of the method described in FIG. 6. When in sensing mode, the controller 50 monitors the sensed voltages $V_{Sens1}$ and $V_{Sens2}$, i.e. the output voltage $V_{out1}$ and $V_{out2}$, across the first and second piezo-electric transducers $P_1$ and $P_2$, respectively, continuously for an analogue implementation or at a rate that is faster compared to the measured signal for a digital implementation. In the case of a human-machine interface, the change in force will typically occur over several milliseconds, consequently a sample rate between 1 kS/s and 10 kS/s is sufficient to get a good representation of the sensed voltage signals $V_{Sens1}$ and $V_{Sens2}$.

With reference to the left side of FIG. 9, when the second piezo-electric transducer $P_2$ is actively driven by the controller 50, and simultaneously a force is applied to the first piezo-electric transducer $P_1$, whereby the sensed voltage signal $V_{Sens1}$ on the first piezo-electric transducer $P_1$ approaches the turn on or leakage voltage of one of the parasitic diodes in the drive switches $Q_{DR}$ or sensing switches $Q_S$, e.g. the third switch $Q_3$ or the fourth switch $Q_4$, the third switch $Q_3$ is turned on to discharge the first output voltage $V_{out}$ corresponding to the first sensing voltage $V_{Sens1}$ of the first piezo-electric transducer $P_1$ to $V_{ref}$, e.g. VDD. The length of time the third switch $Q_3$ is on will depend on several factors, such as the capacitance of the first piezo-electric transducer $P_1$, the conduction channel resistance $R_{dson}$ of the third switch $Q_3$ and the presence of the filter 8. The third switch $Q_3$ should be on long enough to substantially discharge the first piezo-electric transducer $P_1$ from the threshold voltage to 0 V. The time may be between 100 uS and 1 ms for an exemplary embodiment. Just before turning the third switch $Q_3$ on, the first output voltage $V_{out1}$ is measured and added as the current sensed voltage $V_{Sens}$ to an accumulator in or connected to the controller 50 to add each reference voltage segment into the accumulator voltage $V_{acc}$. The accumulator enables the controller 50 to keep track of the actual first and second sensing voltages $V_{Sens1}$ and $V_{Sens2}$ that would have appeared on the piezo-electric transducer $P_1$ or $P_2$ if no parasitic path existed in the switches, e.g. transistors, of the power converter stage.

For the same situation, i.e. while a drive voltage signal $V_{DR2}$ is applied to the second piezo-electric transducer $P_2$, when the force is released from the first piezo-electric transducer $P_1$, the same problem arises as detailed above with reference to FIGS. 4 and 5.

Accordingly, the third switch $Q_3$ may be activated by the controller 50 to zero the first sensed voltage $V_{Sens1}$ or the first output voltage $V_{out1}$ measured across the first piezo-electric transducer $P_1$ each time the first output voltage $V_{out1}$ approaches the turn-on voltages $V_{to1}$, e.g. 0.3 V, of the body diodes of, e.g. the fourth switch $Q_4$ and/or the turn-on voltage $V_{to2}$ of the third switch $Q_3$, i.e. each time the first output voltage $V_{out1}$ reaches the threshold voltages $V_{th1}$ and/or $V_{th2}$, e.g. +/−0.25 V, less than the turn-on voltages $V_{to}$. The algorithm 10 executed by the controller 50 may digitally reconstruct the real total sensing voltage $V_{SensT1}$ across the first piezo-electric transducer $P_1$ by adding up a current sensed voltage $V_{Sens}$, i.e. an interim digital representation thereof, and accumulated voltage $V_{acc}$ from the different segments (See right side of FIG. 8) of the output voltage $V_{out1}$ representing the sensed voltage $V_{Sens}$ moving between 0 and just above the corresponding threshold voltages $V_{to1}$ or $V_{to2}$, i.e. less than the turn-on voltage of the body diode of the third and fourth switches $Q_3$ and $Q_4$, thus providing much better sensing performance for negative voltages across the first piezo-electric transducer $P_1$.

A voltage multiplexer 40 may be connected between the sensing switches $Q_S$, e.g. the third and sixth switches $Q_3$ and $Q_6$, and the controller 50. The voltage multiplexer 40 may provide two functions: 1) multiplex the output voltage signals, e.g. $V_{out1}$ and $V_{out2}$, from different channels, e.g. the first piezo-electric transducer $P_1$ and the second piezo-electric transducer $P_2$, to an amplifier 41 optimized for a small input range, e.g. 100 uV to 100 mV/bit, that provides very accurate reading of the output voltages, e.g. $V_{out1}$ to $V_{outn}$, from the plurality of piezo-electric transducers, e.g. $P_1$ to $P_n$, and enables high sensitivity; and 2) provide a high voltage input device to also protect the low voltage electronics from the high-voltage actuator signal, e.g. 50V, on the plurality of piezo-electric transducers $P_1$ to $P_n$, when they are driven.

With reference to FIG. 10, the voltage multiplexer 40 may comprise a plurality of inputs, one from each piezo-electric transducer, e.g. $P_0$ to $P_n$. Each input is connected to a high voltage switch $Q_{0H}$ to $Q_{nH}$, and a low voltage switch $Q_{0L}$ to $Q_{nL}$. A respective level shifter $S_0$ to $S_n$ is connected between the gates of the high voltage switches $Q_{0H}$ to $Q_{nH}$ and the low voltage switches $Q_{0L}$ to $Q_{nL}$ and the controller 50, which activates a respective one of the high voltage switches $Q_{0H}$ to $Q_{nH}$ and the low voltage switches $Q_{0L}$ to $Q_{nL}$ when the sensing voltage of one of the piezos $P_0$ to $P_n$ is being measured. The high voltage switches protects the low voltage circuitry from any signal that could damage them, typically any signal above a range 1.8V and 5V depending on the exact device used.

The method of limiting the voltage (positive and negative) below a threshold voltage $V_{th}$, at which point current starts to leak in the body diodes of switches, e.g. transistors, connected to the piezo-electric transducers, e.g. the drive switches (transistors) $Q_{DR}$ or sensing switches $Q_S$, such as the third, fourth, fifth and sixth switches $Q_3$, $Q_4$, $Q_5$ and $Q_6$. Using the sensing switches, e.g. the third and sixth switch $Q_3$ and $Q_6$, enables the sensing voltages, e.g. $V_{Sens1}$ to $V_{Sensn}$, from multiple piezo-electric transducers to be read accurately and independently, while sharing the same power transistors for the driver function of the IC. The digital algorithm 10 in the controller 50 enables the sensing voltage signals, e.g. $V_{Sens1}$ and $V_{sens2}$, from the first and/or second piezos $P_1$ and $P_2$ to be digitally reconstructed accurately as if no parasitic path was existing. Based on that reconstructed signal, the piezo-electric transducer system 1 may be used to accurately use multiple piezo-electric transducers as sensors and play haptic waveforms on them.

The sensing algorithm provided in the controller 50 shows the following characteristics: 1) provides accurate sensing of an increase and decrease of pressure on the piezo-electric transducers $P_1$ and $P_2$; 2) compatible with multi-channel architecture; 3) may only require a single transistor, e.g. $Q_3$ or $Q_6$, per sensing channel; 4) enables driving a haptic response on one channel, e.g. piezo $P_1$, while sensing a force application on a different channel, e.g. piezo $P_2$; 5) ability to sense positive and negative voltages across multiple piezo transducers; 6) avoids cross-talk or coupling effect when sensing multiple transducers; 7) direct sensing of low voltage signal at the high voltage nodes enable high sensitivity; 8) configurable "reset" threshold to adapt the method to real parasitic path present in the system; and 9) may not need extra components for sensing than for driving.

The controller 50 for controlling the piezo-electric transducer circuit 2, for example, a digital controller, may be a computer. The controller 50 may contain a processor, a storage device, a memory having software stored therein that defines the abovementioned functionality, input and output (I/O) devices (or peripherals), and a local bus, or local interface allowing for communication within the controller 50. The local interface may be, for example but not limited to, one or more buses or other wired or wireless connections, as is known in the art. The local interface may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor may be a hardware device for executing software, particularly that stored in the memory. The processor may be any custom made or commercially available single core or multi-core processor, a central processing unit (CPU), an auxiliary processor among several processors associated with the present controller 50, a semiconductor based microprocessor, e.g. in the form of a microchip or chip set, a macro-processor, or generally any device for executing software instructions.

The memory may include any one or combination of volatile memory elements, e.g. random access memory (RAM, such as DRAM, SRAM, SDRAM, etc.)) and non-volatile memory elements, e.g., ROM, hard drive, tape, CDROM, etc. Moreover, the memory may incorporate electronic, magnetic, optical, and/or other types of storage media. Note that the memory may have a distributed architecture, where various components are situated remotely from one another, but may be accessed by the processor.

The software may define functionality performed by the controller 50, in accordance with the present invention. The software in the memory may include one or more separate programs, each of which contains an ordered listing of executable instructions for implementing logical functions of the controller 50, as described below. The memory may contain an operating system (O/S). The operating system essentially controls the execution of programs within the controller 50 and provides scheduling, input-output control, file and data management, memory management, and communication control and related services.

The I/O devices may include input devices, for example but not limited to, a keyboard, mouse, scanner, microphone, etc. Furthermore, the I/O devices may also include output devices, for example but not limited to, a printer, display, etc. Finally, the I/O devices may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the controller 50 is in operation, the processor may be configured to execute the software stored within the memory, to communicate data to and from the memory, and to generally control operations of the controller pursuant to the software, as explained above.

When the functionality of the controller 50 is in operation, the processor may be configured to execute the software stored within the memory, to communicate data to and from the memory, and to generally control operations of the controller pursuant to the software. The operating system may be read by the processor, perhaps buffered within the processor, and then executed.

When the controller 50 is implemented in software, it should be noted that instructions for implementing the controller 50 may be stored on any computer-readable medium for use by or in connection with any computer-related device, system, or method. Such a computer-readable medium may, in some embodiments, correspond to either or both the memory or the storage device. In the context of this document, a computer-readable medium is an electronic, magnetic, optical, or other physical device or means that may contain or store a computer program for use by or in connection with a computer-related device, system, or method. Instructions for implementing the system may be embodied in any computer-readable medium for use by or in connection with the processor or other such instruction execution system, apparatus, or device. Although the processor has been mentioned by way of example, such instruction execution system, apparatus, or device may, in some embodiments, be any computer-based system, processor-containing system, or other system that can fetch the instructions from the instruction execution system, apparatus, or device and execute the instructions. In the context of this document, a "computer-readable medium" may be any means that can store, communicate, propagate, or transport the program for use by or in connection with the processor or other such instruction execution system, apparatus, or device.

Such a computer-readable medium may be, for example but not limited to, an electronic, magnetic, optical, electromagnetic, infrared, or semiconductor system, apparatus, device, or propagation medium. More specific examples, i.e. a non-exhaustive list, of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where the controller 50 is implemented in hardware, the controller 50 may be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A method of operating a piezo-electric transducer with a piezo-electric driver circuit, including a first switch with a first parasitic conduction path, the method comprising:
   repeatedly sensing a first sensed voltage generated by a first force applied to a first piezo-electric transducer;
   discharging the first sensed voltage each time the first sensed voltage approaches a first trigger level of the first parasitic conduction path, thereby generating a plurality of first voltage segments; and
   determining a first total sensed voltage across the first piezo-electric transducer from the plurality of first segment voltages.

2. The method according to claim 1, further comprising comparing the first sensed voltage to a first threshold voltage based on the first trigger level.

3. The method according to claim 2, wherein the determining step includes:
   generating a digital representation of one of the plurality of first voltage segments each time the first sensed voltage reaches the first threshold voltage;
   updating a first accumulation sum with each digital representation each time the first sensed voltage reaches the first threshold voltage; and
   determining the first total sensed voltage across the first piezo-electric transducer from the first accumulation sum.

4. The method according to claim 3, wherein the determining step further includes:
   generating an interim digital representation of each first sensed voltage, each time the first sensed voltage is sensed; and
   determining the first total sensed voltage across the first piezo-electric transducer from the first accumulation sum and the interim digital representation.

5. The method according to claim 1, wherein the first switch in the piezo-electric driver circuit comprises a driver circuit switch including the first parasitic conduction path, wherein the method comprises transmitting a drive voltage to the first piezo-electric transducer for generating a force or displacement response on the first piezo-electric transducer.

6. The method according to claim 5, further comprising:
generating an interim digital representation of each first sensed voltage, each time the first sensed voltage is sensed; and
wherein the step of transmitting the drive voltage includes transmitting the drive voltage when the first total-sensed voltage plus the interim digital representation is greater than a predetermined activation level.

7. The method according to claim 5, wherein the piezo-electric driver circuit includes a second switch with a second parasitic conduction path; and
wherein the method further comprises:
comparing the first sensed voltage to a second threshold voltage based on a second trigger level of the second parasitic path;
discharging the first sensed voltage each time the first sensed voltage reaches the second threshold voltage, thereby generating a plurality of second voltage segments;
determining a second total sensed voltage across the first piezo-electric transducer from the plurality of second segment voltages.

8. The method according to claim 1, wherein the piezo-electric driver circuit is also configured for selectively transmitting a drive voltage across a second piezo-electric transducer; and
further comprising determining the first total sensed voltage across the first piezo-electric transducer while the driver circuit is transmitting the drive voltage across the second piezo-electric transducer.

9. The method according to claim 1, further comprising:
sensing a second sensed voltage generated by a second force applied to a second piezo-electric transducer;
comparing the second sensed voltage to a second threshold voltage based on a second trigger level of a second parasitic path of the second piezo-electric transducer;
discharging the second sensed voltage each time the second sensed voltage reaches the second threshold voltage, thereby generating a plurality of second voltage segments;
determining a second total sensed voltage across the second piezo-electric transducer from the plurality of second voltages segments.

10. The method according to claim 9, further comprising:
discharging the first sensed voltage with a first sensing switch each time the first sensed voltage approaches a third trigger level of a third parasitic conduction path from the first sensing switch generating a plurality of first segment voltages; and
discharging the second sensed voltage with a second sensing switch each time the second sensed voltage approaches a fourth trigger level of a fourth parasitic conduction path from the second sensing switch generating a plurality of second segment voltages.

11. The method according to claim 9, further comprising determining the second total sensed voltage across the second piezo-electric transducer while the piezo-electric driver circuit is transmitting a drive voltage on the first piezo-electric transducer.

12. An apparatus for operating a first piezo-electric transducer, configured for coupling to a voltage source, which provides an input voltage, and configured to transmit a drive voltage across the first piezo-electric transducer, the apparatus comprising:
a driver circuit, comprising a first driver circuit switch including a first parasitic conduction path, configured to be connected to the first piezo-electric transducer, the driver circuit configured to receive the input voltage and transmit the drive voltage for generating a force or displacement response on the first piezo-electric transducer;
a sensing circuit configured to sense a first sensed voltage generated by a first force applied to the first piezo-electric transducer, the sensing circuit including a first sensing switch; and
a controller configured to control the first driver switch and the first sensing switch, to discharge the first sensed voltage each time the first sensed voltage approaches a first trigger level of the first parasitic conduction path generating a plurality of first segment voltages, and configured to determine a first total sensed voltage across the first piezo-electric transducer from the plurality of first segment voltages.

13. The apparatus according to claim 12, wherein the controller is also configured to compare the first sensed voltage to a first threshold voltage based on the first trigger level.

14. The apparatus according to claim 13, wherein the controller is also configured to:
generate a digital representation of one of the plurality of first voltage segments each time the first sensed voltage reaches the first threshold voltage;
update a first accumulation sum with each digital representation each time the first sensed voltage reaches the first threshold voltage; and
determine the first total sensed voltage across the first piezo-electric transducer based the first accumulation sum.

15. The apparatus according to claim 14, wherein the controller is also configured to:
generate an interim digital representation of each first sensed voltage, each time the first sensed voltage is sensed; and
determine the first total sensed voltage across the first piezo-electric transducer from the first accumulation sum and the interim digital representation.

16. The apparatus according to claim 14, wherein the controller is also configured to:
generate an interim digital representation of each first sensed voltage, each time the first sensed voltage is sensed; and
transmit the drive voltage when the first total sensed voltage, comprising the first accumulation sum plus the interim digital representation, is greater than a predetermined activation level.

17. The apparatus according to claim 12, wherein the driver circuit includes a second driver switch with a second parasitic conduction path; and
wherein the controller is further configured to:
compare the first sensed voltage to a second threshold voltage based on a second trigger level of the second parasitic path;
discharge the first sensed voltage each time the first sensed voltage reaches the second threshold voltage, thereby generating a plurality of second voltage segments;
determine a second total sensed voltage across the first piezo-electric transducer from the plurality of second segment voltages.

18. The apparatus according to claim 12, wherein the driver circuit further comprise a second driver circuit switch with a second parasitic conduction path configured to transmit the drive voltage on a second piezo-electric transducer;

wherein the sensing circuit is also configured to sense a second sensed voltage generated by a second force applied to the second piezo-electric transducer;

wherein the sensing circuit includes a second sensing switch configured to discharge the second sensed voltage each time the second sensed voltage approaches a second trigger level of the second parasitic conduction path generating a plurality of second segment voltages; and wherein the controller is also configured to determine a second total sensed voltage across the second piezo-electric transducer from the plurality of second segment voltages.

19. The apparatus according to claim 18, wherein the controller is also configured to:

control the first sensing switch, to discharge the first sensed voltage each time the first sensed voltage approaches a third trigger level of a third parasitic conduction path from the first sensing switch generating the plurality of first segment voltages; and control the second sensing switch, to discharge the second sensed voltage each time the second sensed voltage approaches a fourth trigger level of a fourth parasitic conduction path from the second sensing switch generating the plurality of second segment voltages.

20. The apparatus according to claim 19, wherein the controller is also configured to determine the first sensed voltage across the first piezo-electric transducer from the plurality of first segment voltages while the driver circuit is transmitting the drive voltage on the second piezo-electric transducer.

* * * * *